(12) United States Patent
Tanaka

(10) Patent No.: US 6,359,803 B1
(45) Date of Patent: Mar. 19, 2002

(54) SEMICONDUCTOR MEMORY DEVICE THAT CAN ACCESS TWO REGIONS ALTERNATELY AT HIGH SPEED

(75) Inventor: Shinji Tanaka, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/759,319

(22) Filed: Jan. 16, 2001

(30) Foreign Application Priority Data

Jul. 18, 2000 (JP) .............................. 12-217069

(51) Int. Cl.[7] .................................. G11C 5/06

(52) U.S. Cl. ................ 365/63; 365/189.01; 365/189.05; 365/230.08

(58) Field of Search ............................ 365/63, 230.03, 365/226, 189.01, 189.05, 189.04, 230.05, 230.08

(56) References Cited

U.S. PATENT DOCUMENTS 5,610,870 A * 3/1997 Choi ........................... 365/226
6,157,560 A * 12/2000 Zheng ........................... 365/63

FOREIGN PATENT DOCUMENTS

JP 5-54637 3/1993
JP 409246482 A * 9/1997 .......... G11C/11/401

* cited by examiner

Primary Examiner—David Nelms
Assistant Examiner—David Lam
(74) Attorney, Agent, or Firm—McDermott, Will & Emery

(57) ABSTRACT

A latch is provided corresponding to each column. The data read out onto a bit line pair can be copied to the latch circuit when a signal TG is driven to an H level. Since data read out from the latch does not require row addressing, data can be read out from a particular column address by rendering a latch select line active even in the case where a word line corresponding to another row address is active. A semiconductor memory device that is not reduced in the effective transfer rate can be provided even in the case where alternate access is effected starting continuously from two different row addresses in the same bank.

11 Claims, 19 Drawing Sheets

SEMICONDUCTOR MEMORY DEVICE THAT CAN ACCESS TWO REGIONS ALTERNATELY AT HIGH SPEED

BACKGROUND OF THE INVENTION

1. Field of the Invention

The present invention relates to a semiconductor memory device that can operate at high speed.

2. Description of the Background Art

Recent computers are incorporated with a main memory and a cache memory. A dynamic random access memory (DRAM) or the like is generally used for the main memory. The dynamic random access memory having a large capacity is slow in operation. Therefore, for the purpose of temporarily storing a portion of data of the main memory and carrying out frequent access to a particular address speedily, a cache memory capable of high speed operation, but of small storage capacity, is used. A static random access memory (SRAM) or the like is generally used for the cache memory.

There is the case where data of a large amount is read out, modified, and written back in a system incorporating such a cache memory. For example, such a process includes the image data correction process and the like.

FIG. 16 is a schematic diagram to describe the operation of reading out data, modifying the data, and writing back the data.

Referring to FIG. 16, a main memory 506 has addresses M0–M13, and a cache memory 504 has addresses C0–C4. Here, it is assumed that the amount of data that can be stored in one of addresses C0–C4 of the cache memory 504 is equal to the amount of data that can be stored in one of addresses M0–M13 of the main memory 506.

The operation of sequentially reading out data stored in addresses M0–M13 of the main memory 506, modifying the data in a CPU 502, and then writing back the data into addresses M0–M13 of the main memory 506 will be described here.

At step S1, data stored in address M0 of the main memory 506 is copied into address C0 of the cache memory 504, and then read into the CPU 502. The CPU 502 outputs the modified data. In general, the modified data is temporarily stored in the cache memory 504. When there is no more empty region in the cache memory 504, the data in the cache memory 504 is transferred to the main memory 506. At the current point, the modified data is stored in address C0 of the cache memory 504, and not yet transferred to the main memory 506.

At steps S2–S5, the data in addresses M1–M4 of the main memory 506 are similarly copied into addresses C1–C4 of the cache memory 504. The CPU 502 provides respective modified data to the cache memory 504, whereby the data retained in addresses C1–C4 of the cache memory 504 are rewritten.

At this time point, there is no more empty region in the cache memory 504. In the subsequent process, data is read out from the main memory 506 into the cache memory 504 after the process of writing the modified data back into the main memory 506.

At step S6, the modified data stored in address C0 of the cache memory 504 is written back into address M0 of the main memory 506. At step S7, the data retained in address M5 of the main memory 506 is read into address C0 of the cache memory 504.

At step S8, the data stored in address C1 of the cache memory 504 is written back into address M1 of the main memory 506. At step S9, the data retained in address M6 of the main memory 506 is read into address C1 of the cache memory 504.

Thereafter, writing back data from the cache memory 504 into the main memory 506, and reading out data from the main memory 506 into the cache memory 504 are carried out similarly. In this case, data readout and data writing are carried out alternately in the main memory 506 with respect to continuous read and write addresses apart from each other by a constant address.

FIG. 17 shows a schematic structure of a conventional semiconductor memory device.

Referring to FIG. 17, a conventional semiconductor memory device 511 receives control signals CS, RAS, CAS, WE, an address signal ADR, and a bank address signal BANK from a memory control device 519 incorporated in a computer system or the like to transfer data DATA.

Semiconductor memory device 511 includes a control circuit 512 receiving control signals CS, RAS, CAS, and WE, address signal ADR and bank address signal BANK to output a row address RA and a column address CA, and also a data input signal DIN according to data DATA, or provides data DATA to memory control device 519 according to a data output signal DOUT read out, a row decoder 513, a column decoder 514, an amplify circuit band 516, and a memory cell array 517.

Row decoder 513 renders active one of a plurality of word lines WL according to an externally specified row address RA. Column decoder 514 renders active one of a plurality of column select lines CSL according to an externally specified column address CA. A memory cell located at the crossing between activated word line WL and column select line CSL is selected from the memory cell array.

An address signal ADR specifying a word line is provided together with an active command ACT. This address signal ADR is recognized as row address RA. An address signal ADR specifying a column select line is applied together with a read command RD or a write command WRT. This address signal ADR is recognized as column address CA. Read command RD and write command WRT designate reading and writing operations with respect to memory cells of respective specified addresses.

FIG. 18 is a circuit diagram showing a structure of a conventional memory cell array 517 of FIG. 17.

Referring to FIG. 18, each of memory cells Cell00–Cell21 is formed of a capacitor having one end coupled to a cell plate potential Vcp of a constant potential, and a transistor connected to the other end of the capacitor. The transistor is controlled by word line WL, and has the other end connected to a bit line BL or /BL. Sense amplifiers 24 and 44 are provided corresponding to the bit line pair of lines BL, /BL. Also corresponding to the bit line pair are provided transistors 22 and 42 equalizing the potentials of bit lines BL and /BL according to a signal BLEQ. Bit lines BL, /BL are connected to local IO lines LIO, /LIO via select gates 26 and 56 respectively controlled according to column select signals CSL0 and CSL1.

Local IO lines LIO, /LIO are connected to global IO lines GIO, /GIO by a gate circuit 60 rendered conductive by a signal IOSW0.

A read amplifier 64 and a write data drive circuit 62 are connected to global IO lines GIO, /GIO. Read amplifier 64 amplifies the potentials of global IO lines GIO, /GIO to output a signal DOUT. Write data drive circuit 62 functions to drive complementarily global IO lines GIO, /GIO according to a data input signal DIN.

Referring to FIG. 16 again, data is read out from address M4 of the main memory into address C4 of the cache memory on a computer having a cache memory (S5). The CPU modifies the read out data. The modified data is temporarily retained in the cache memory. Then, data is written back from address C0 of the cache memory into address M0 of the main memory (S6). Consider the case where data is read out from address M5 of the main memory into address C0 of the cache memory (S7).

FIG. 19 is an operation waveform diagram to describe the case where access is effected to a main memory employing a synchronous semiconductor memory device (SDRAM).

It is assumed that addresses M0, M4 and M5 of the main memory correspond to (row address RA, column address CA)=(000, 000), (001, 000), (001, 001), respectively, in FIG. 19. It is assumed that bank addresses BANK are all 0. Addresses M0, M4 and M5 correspond to memory cells Cell00, Cell10, and Cell11, respectively, in FIG. 18.

Referring to FIG. 19, command ACT and address "001" are input at time T1. Signal BLEQ is pulled down to an L level, and equalization of the bit line pair is canceled. Then, word line WL1 attains an H level.

Memory cells Cell10 and Cell11 of FIG. 18 are selected. The data stored in these memory cells are transmitted onto bit line BL. Then, a sense amplifier activation signal S0 is pulled up to an H level, whereby the potential difference of the bit line pair is amplified. In the case where the data stored in memory cells Cell10 and Cell11 are "H" and "L", respectively, bit line BL0 is driven to an H level whereas bit line BL1 is driven to an L level. Although not depicted in the waveform diagram, bit line /BL takes a value complementary to the value of bit line BL.

At time T2, read command RD and address "000" are input, whereby column select line CSL0 is selected. The transistor of gate circuit 26 is rendered conductive, whereby the potential of bit line BL0 is transmitted via this transistor. As a result, local IO line LIO attains an H level. Then, signal IOSW0 attains an H level, whereby the transistor of gate circuit 60 is rendered conductive. Global IO line GIO attains an H level via this conducting transistor. Then, read amplifier 64 amplifies the same to output a data output signal DOUT.

Although the data in the cache memory is rewritten, the rewritten data is not yet transferred to the main memory.

At time T3, a precharge command PRE is input. In response, the potential of word line WL1 attains an L level, whereby the memory cells are disconnected from the bit lines. Then, signal BLEQ attains an H level, and sense amplifier activation signal S0 attains an L level. The sense amplifiers rendered inactive, and the bit line pair is equalized.

At time T4, active command ACT and address "000" are input. In response, signal BLEQ is pulled down to an L level, whereby equalization of the bit line pair is canceled. Word line WL0 is rendered active. In response, memory cells Cell00 and Cell01 are selected. The data retained in these memory cells are transmitted to corresponding bit lines, followed by operation of the sense amplifier. Bit lines BL0 and BL1 attain an L level and an H level, respectively, corresponding to the data stored in the memory cells.

At time T5, signals of an H level are input as data DATA with write command WRT and address "000" to write the data of address C0 in the cache memory back into memory cell Cell00.

In response, data input signal DIN attains an H level, whereby global IO line GIO is driven to an H level. Then, signal IOSW0 attains an H level, whereby local IO line LIO is pulled up to an H level. The level of column select line is H, whereby the H level of local IO line LIO is transmitted to data bit line BL0. Then, the data in memory cell Cell00 is rewritten into "H".

At time T6, precharge command PRE is input, and word line WL0 is rendered inactive. Then, signal BLEQ and sense amplifier activation signal S0 attain an H level and an L level, respectively, whereby the sense amplifier is rendered inactive. The bit line pair is equalized.

At time T7, active command ACT and address "001" are input. Signal BLEQ attains an L level, and equalization of the bit line pair is canceled. Word line WL1 is rendered active.

At time T8, read command RD and address "001" are input, and column select line CSL1 is rendered active. In response, the transistor in gate circuit 56 conducts, whereby the potential of bit line BL1 is transmitted to local IO line LIO via the transistor. As a result, the potential of local IO line LIO attains an L level. Then, signal IOSW0 attains an H level. Global IO line GIO attains an L level via the transistor of gate circuit 60. Read amplifier 64 amplifies the potential of global IO line GIO to output data output signal DOUT of an L level.

When reading or writing is to be carried out with respect to memory cells connected to different word lines in the same bank, three commands are necessary to each cycle of reading and writing. More specifically, commands ACT, RD and PRE are required for a read cycle, whereas commands ACT, WRT and PRE are required for a write cycle. This operation will require three times the period of time than repeating readout from continuous addresses such as a burst read operation. Therefore, the effective transfer rate of data is greatly degraded.

Thus, in a computer incorporating a main memory such as a SDRAM of conventional structure, there was a problem that the effective transfer rate with respect to the main memory is extremely degraded when data of a great amount exceeding the capacity of the cache memory is read out, modified, and written back.

SUMMARY OF THE INVENTION

An object of the present invention is to provide a semiconductor memory device suited for a main memory that is not reduced in effective transfer rate even when data of a great amount exceeding the capacity of the cache memory is read out, modified, and written back.

According to an aspect of the present invention, a semiconductor memory device includes a plurality of memory cells, a plurality of word lines, a plurality of bit line pairs, a plurality of sense amplifiers, a data line pair, a plurality of first connection circuits, a plurality of data retain circuits, and a plurality of second connection circuits.

The plurality of memory cells are arranged in a matrix. The plurality of word lines are provided corresponding to respective rows of memory cells. The plurality of bit line pairs are provided corresponding to respective columns of memory cells. The plurality of sense amplifiers are provided corresponding to the plurality of bit line pairs, respectively. The data line pair is provided common to the plurality of bit line pairs to transfer stored data with respect to an external source. The plurality of first connection circuits selectively connect the plurality of bit line pairs to a data line pair according to an applied column address. The plurality of data retain circuits are provided corresponding to the plurality of bit line pairs, respectively. The plurality of second connection circuits connect the plurality of data retain circuits to the plurality of bit line pairs, respectively.

According to another aspect of the present invention, a semiconductor memory device includes a plurality of memory cell array blocks, a block decode circuit, and a select circuit.

Each memory cell array block includes a plurality of memory cells arranged in a matrix, a plurality of word lines each provided corresponding to a row of memory cells, a plurality of bit line pairs each provided corresponding to a column of memory cells, a plurality of sense amplifiers provided corresponding to a plurality of bit line pairs, respectively, a local data line pair provided common to the plurality of bit line pairs to transfer stored data with respect to an external source, a plurality of first connection circuits selectively connecting the plurality of bit line pairs to a local data line pair according to a column address, a plurality of data retain circuits provided corresponding to the plurality of bit line pairs, respectively, and a plurality of second connection circuits connecting the plurality of data retain circuits to the plurality of bit line pairs, respectively.

The block decode circuit selects any of the plurality of memory cell array blocks according to an applied row address. The select circuit transfers data with respect to any of the plurality of memory cell array blocks according to the output of the block decode circuit.

The select circuit includes a global data line pair provided common to the plurality of memory cell array blocks, a plurality of switch circuits provided corresponding to the plurality of memory cell array blocks, respectively, selectively connecting a local data line pair of the plurality of memory cell array blocks to a global data line pair, and a switch drive circuit rendering active any of the plurality of switch circuits according to an output of the block decode circuit.

The switch drive circuit includes a retain unit retaining the output of the block decode circuit.

Therefore, the main advantage of the present invention is that a readout address does not have to be specified when a write address and a read address are apart and reading and writing are repeated alternately to allow high speed operation, since a data retain circuit retaining data of a memory cell read out by a column select operation is provided.

Another advantage of the present invention is that, when there are a plurality of memory cell array blocks, high speed readout is allowed without addressing even when a block is to be selected by a row address since information of a memory cell array block corresponding to data stored in the data retain circuit is retained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
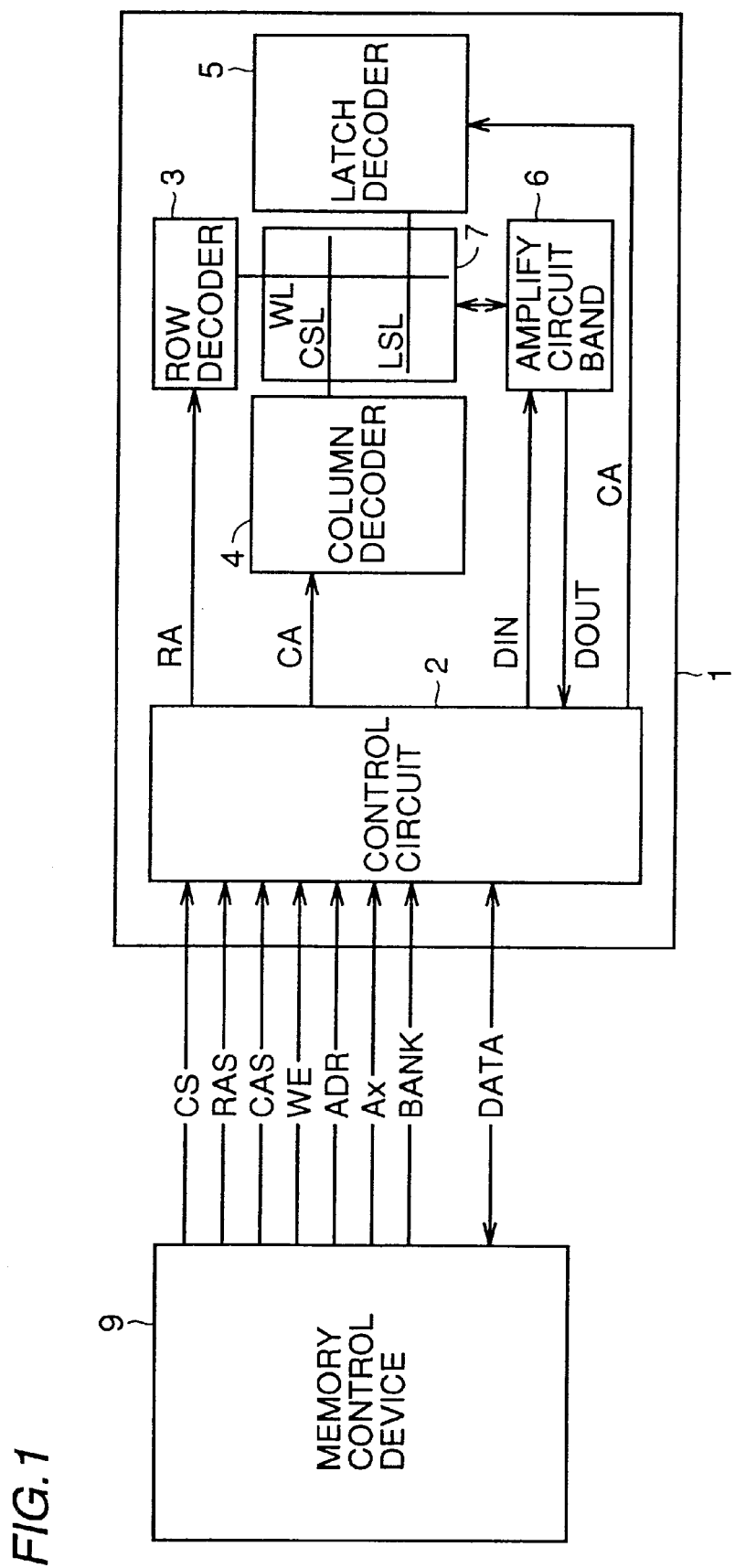
FIG. 1 is a schematic block diagram to describe a structure of a semiconductor memory device according to a first embodiment of the present invention.

Embodiments of the present invention will be described hereinafter with reference to the drawings. In the drawings, the same reference characters denote the same or corresponding components.

First Embodiment

FIG. 1 is a schematic block diagram to describe a structure of a semiconductor memory device according to a first embodiment of the present invention.

Referring to FIG. 1, semiconductor memory device 1 receives control signals CS, RAS, CAS, WE and Ax, an address signal ADR, and a bank address signal BANK from a memory control circuit 9 incorporated in a computer and the like. Semiconductor memory device 1 transfers data DATA with respect to memory control device 9.

Semiconductor memory device 1 includes a control circuit 2 providing a row address RA and a column address CA according to control signals CS, RAS, CAS, WE, Ax and address signals ADR and BANK, and provides a data input signal DIN to a memory cell array or receives a data output signal DOUT from the memory cell array, a row decoder 3 rendering active one of a plurality of word lines WL according to a row address RA, a column decoder 4 rendering active one of a plurality of column select lines CSL according to a column address CA, a latch decoder 5 rendering active one of a plurality of latch select lines LSL according to column address CA, a memory cell array 7, and an amplify circuit band 6 relaying data transfer between memory cell array 7 and control circuit 2.

Specification of a latch select line LSL characteristic of the present invention is effected by a command LRD. Command LRD renders active a latch select line in a one-to-one correspondence with column address CA. Latch select line LSL can be selected without specification of a word line WL.

Figure 2:
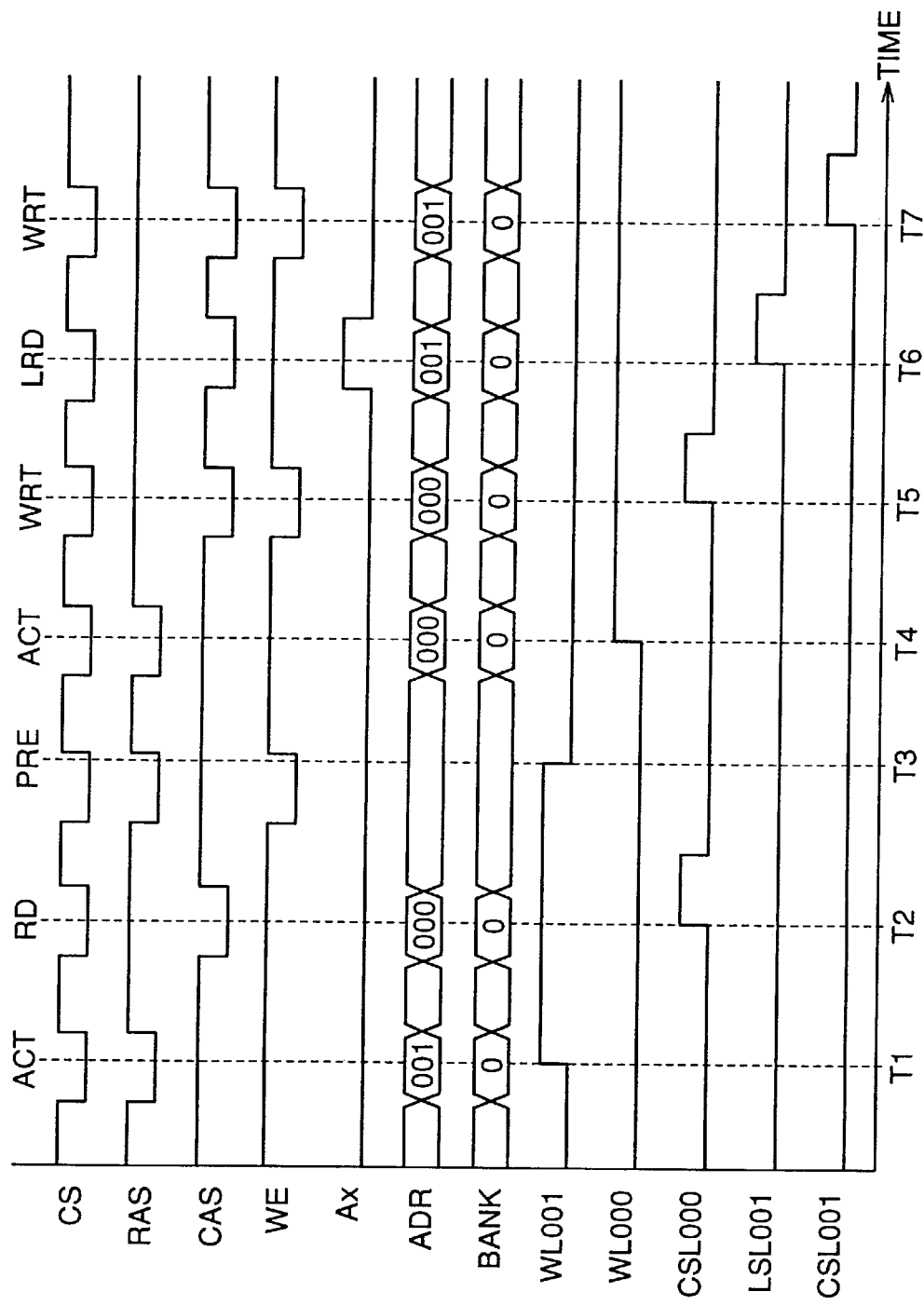
FIG. 2 is an operation waveform diagram to describe a schematic operation when the semiconductor memory device of the present invention is used as a main memory.

FIG. 2 is an operation waveform diagram to describe the operation schematically when the semiconductor memory device of the present invention is employed as a main memory.

FIG. 2 corresponds to the case where data is read out from a region specified by a row address "001" in bank "0", and then data is written into a region specified by row address "000" in bank "0". In this case, active command ACT to enter "001" as a row address is input at time T1. This input is required only for the first time.

In carrying out reading and writing alternately for the second time onward at time T5–T7, readout is effected by a latch read command LRD that does not require specification of a row address. For a write command WRT effecting a writing operation, the row address specified at time T4 is also used. From time T5 onward, a write command WRT and a latch read command LRD can be continuously input alternately without having to specify a row address.

Thus, the SDRAM of the present invention is not degraded in the effective transfer rate even if access to addresses remote from each other in the same bank is effected continuously.

Figure 3:
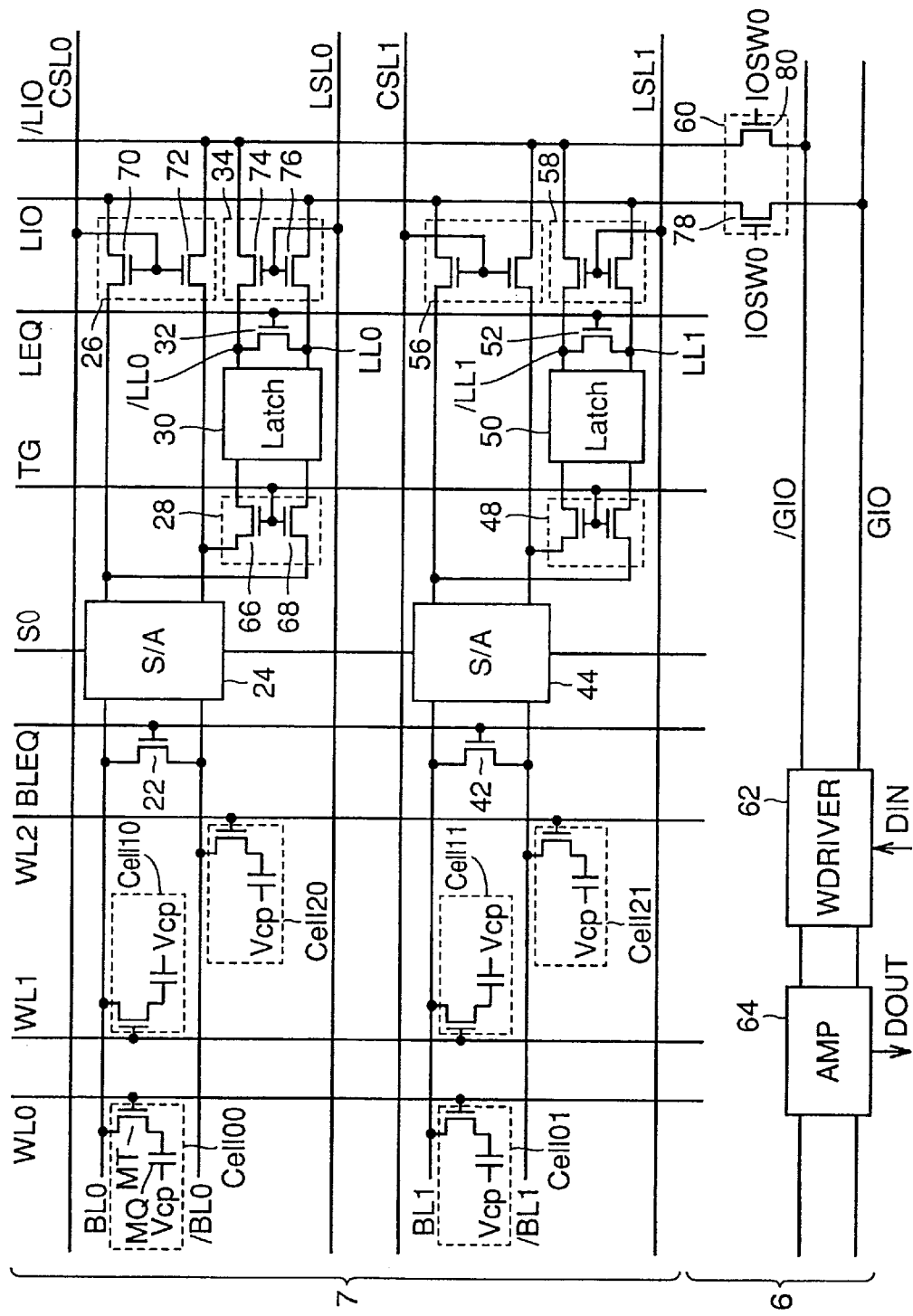
FIG. 3 is a circuit diagram to describe a structure of a memory cell array 7 of FIG. 1.

FIG. 3 is a circuit diagram to describe a structure of memory cell array 7 of FIG. 1.

Referring to FIG. 3, memory cell array 7 includes memory cells Cell00–Cell21 arranged in a matrix, a bit line BL0 to which memory cells Cell00 and Cell01 are connected, a bit line /BL0 to which memory cell Cell20 is connected, a bit line BL1 to which memory cells Cell01 and Cell11 are connected, and a bit line /BL1 to which memory cell Cell21 is connected.

In FIG. 3, six memory cells are depicted representative of a plurality of memory cells. Memory cell array 7 further includes a word line WL0 to select memory cells Cell00 and Cell01, a word line WL1 to select memory cells Cell10 and Cell11, a word line WL2 to select memory cells Cell20 and Cell21. Each of memory cells Cell00 –Cell21 includes a capacitor MQ having one end coupled to a cell plate potential Vcp, and a transistor MT connected between the other end of capacitor MQ and a bit line, and having a gate connected to a word line.

Memory cell array 7 further includes transistors 22 and 42 rendered conductive according to signal BLEQ to connect bit lines BL0 and BL1 to bit lines /BL0 and /BL1, respectively, a sense amplifier 24 rendered active according to sense amplifier activation signal S0 to increase the potential difference generated between bit line BL0 and bit line /BL0, a sense amplifier 44 rendered active according to sense amplifier activation signal S0 to increase the potential difference generated between bit line BL1 and bit line /BL1, a gate circuit 26 connecting bit lines BL0 and /BL0 to local IO lines LIO and /LIO, respectively, according to activation of column select line CSL0, and a gate circuit 56 connecting bit lines BL1 and /BL1 to local IO lines LIO, /LIO, respectively, according to activation of column select line CSL1.

Gate circuit 26 includes a transistor 70 having a gate connected to column select line CSL0, and connected between bit line BL0 and local IO line LIO, and a transistor 72 connected between bit line /BL0 and local IO line /LIO, having a gate connected to column select line CSL0. Gate circuit 56 has a structure similar to that of gate circuit 26. Therefore, description thereof will not be repeated.

Memory cell array 7 further includes a latch 30 provided corresponding to the bit line pair of bit lines BL0 and /BL0, a latch 50 provided corresponding to the bit line pair of the bit lines BL1 and /BL1, a gate circuits 28 rendered active according to signal TG to connect bit lines BL0 and /BL0 to latch 30, and a gate circuit 48 rendered active according to signal TG to connect bit lines BL1 and /BL1 to latch 50. Gate circuit 28 includes a transistor 68 connected between bit line BL0 and latch 30, and receiving signal TG at its gate, and a transistor 66 connected between bit line /BL0 and latch 30, receiving signal TG at its gate. Gate circuit 48 has a structure similar to that of gate circuit 28. Therefore, description thereof will not be repeated.

Memory cell array 7 further includes latch lines LL0 and /LL0 to store data in latch 30 by transmitting data complementary to each other, and latch lines LL1 and /LL1 to store data in latch 50 by transmitting complementary data.

Memory cell array 7 further includes a transistor 32 rendered conductive according to signal LEQ to connect latch line LL0 to latch line /LL0, and a transistor 52 rendered conductive according to signal LEQ to connect latch line LL1 with latch line /LL1.

Memory cell array 7 further includes a gate circuit 34 connecting latch lines LL0 and /LL0 to local IO lines LIO and /LIO, respectively, according to latch select line LSL0, and a gate circuit 58 rendered active according to latch select line LSL1 to connect latch lines LL1 and /LL1 to local IO lines LIO and /LIO, respectively. Gate circuit 34 includes a transistor 76 provided between latch line LL and local IO line LIO, and having a gate connected to latch select line LSL, and a transistor 74 connected between latch line /LL and local IO line /LIO, having a gate connected to latch select line LSL. Gate circuit 58 has a structure similar to that of gate circuit 34. Therefore, description thereof will not be repeated.

At the output of memory cell array 7 is provided a gate circuit 60 connecting local IO lines LIO and /LIO to global IO lines GIO and /GIO, respectively, according to signal IOSW0. Gate circuit 60 includes a transistor 78 connected between local IO line LIO and global IO line GIO, receiving signal IOSW0 at its gate, and a transistor 80 connected between local IO line /LIO and global IO line /GIO, receiving signal IOSW0 at its gate.

The data transmitted to global IO line GIO and /GIO is transferred to read amplifier 64 to be amplified and output as data output signal DOUT.

Also, a write data drive circuit 62 is provided receiving data input signal DIN to transmit write data to the memory cell array via a global IO line.

Figure 4:
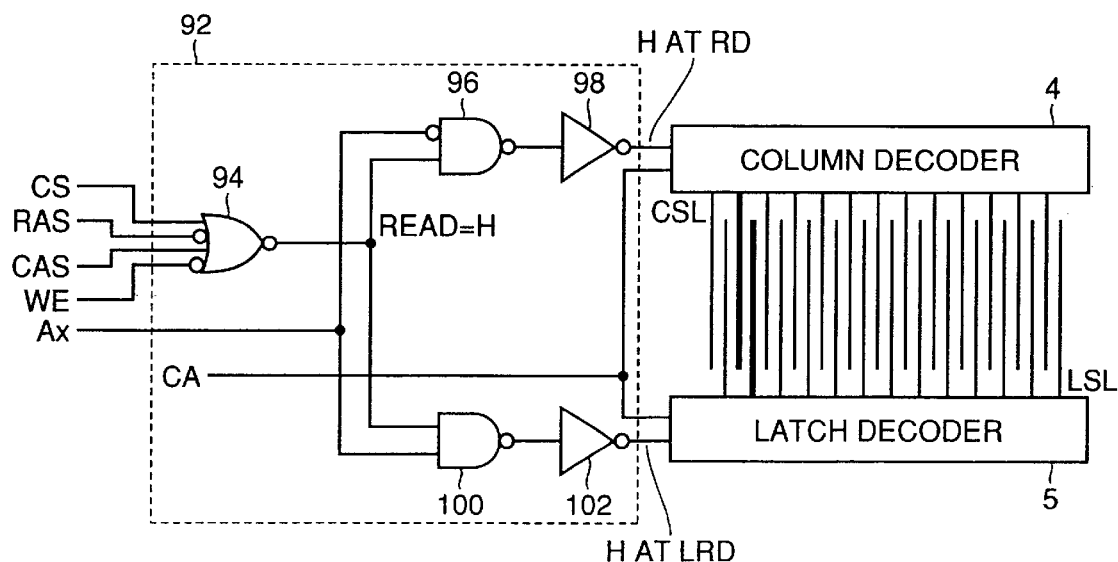
FIG. 4 is a circuit diagram to describe a structure of rendering column select line CSL and a latch select line LSL active from each command control signal.

FIG. 4 is a circuit diagram to describe a structure of rendering column select line CSL and latch select line LSL active from each command control signal.

Referring to FIG. 4, column decoder 4 and latch decoder 5 both receive column address CA to select and drive a column select line CSL and a latch select line LSL, respectively. Decoder select unit 92 is a portion of control circuit 2 of FIG. 1.

Decoder select unit 92 includes a gate circuit 94 receiving and decoding control signals CS, RAS, CAS and WE to detect a read command, a gate circuit 96 detecting that control signal Ax is at an L level and signal READ output from gate circuit 94 is at an H level, and an inverter 98 inverting the output of gate circuit 96 to output to column decoder 4 a signal that attains an H level when read command RD is input.

Decoder select unit 92 further includes a NAND circuit 100 receiving control signal Ax and the output of gate circuit 94, and an inverter 102 receiving and inverting the output of NAND circuit 100 to output to latch decoder 5 a signal that attains an H level when latch read command LRD is input.

More specifically, decoder select unit 92 functions to determine whether column decoder 4 or latch decoder 5 is to be rendered active according to control signal Ax when a read command has been input according to a combination of control signals CA, RAS, CAS and WE.

Figure 5:
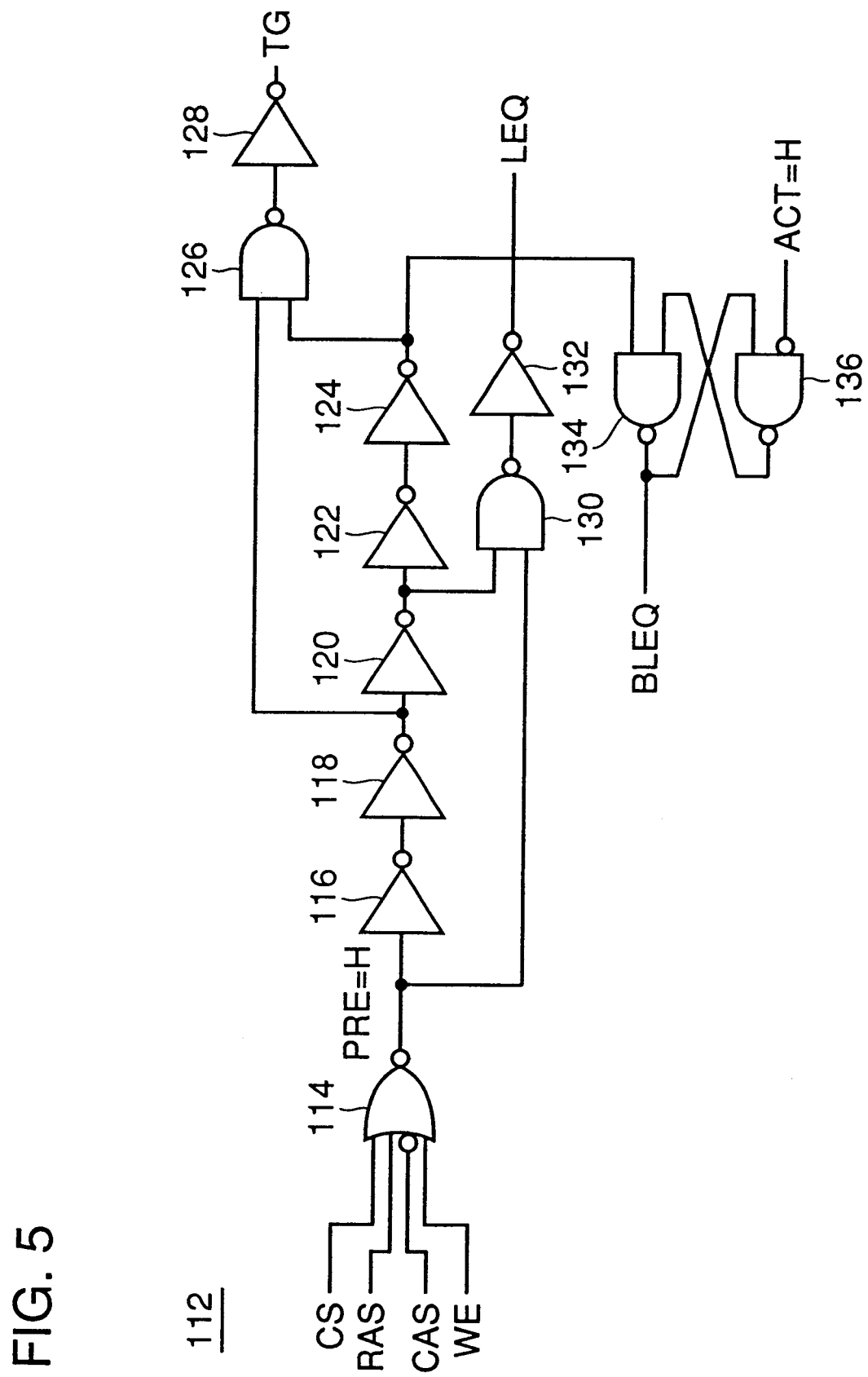
FIG. 5 is a circuit diagram showing a structure of a signal generation circuit 112 which is a portion of a control circuit 2 of FIG. 1.

FIG. 5 is a circuit diagram showing a structure of a signal generation circuit 112 which is a portion of control circuit 2 of FIG. 1.

Referring to FIG. 5, signal generation circuit 112 includes a gate circuit 114 receiving control signals CS, RAS, CAS and WE, and detecting a precharge command PRE to output a signal of an H level when precharge command PRE is input, inverters 116, 118, 120, 122 and 124 connected in series to receive the output of gate circuit 114, a NAND circuit 126 receiving the outputs of inverters 118 and 124, and an inverter 128 receiving and inverting the output of NAND circuit 126 to output a signal TG.

Signal generation circuit 112 further includes a NAND circuit 130 receiving the outputs of gate circuit 114 and inverter 120, an inverter 132 receiving and inverting the output of NAND circuit 130 to output a signal LEQ, a NAND circuit 134 receiving the output of inverter 124 at the first input to output a signal BLEQ, and a gate circuit 136 providing a signal of an L level when signal BLEQ is at an H level and command ACT is input. The output of gate circuit 136 is applied to the second input of NAND circuit 134.

Signals TG and LEQ are generated in synchronization with precharge command PRE. Therefore, signals TG and LEQ can be generated from signals delayed by inverters 116–124 from gate circuit 114 that detects precharge command PRE. Since signals TG and LEQ are both one shot pulses, signals TG and LEQ can be generated by NAND circuits 126 and 130 receiving as inputs delayed signals of the precharge detection signals shifted in phase corresponding to the odd numbered stages of inverters of 3.

Upon detection of precharge command PRE by gate circuit 114, the output node of gate circuit 114 attains an H level. Here, the output node of inverter 120 to which a precharge command is transmitted later is at an H level until the signal is transmitted. In other words, the output of NAND circuit 130 is driven to an L level since the two inputs of NAND circuit 130 both attain an H level temporarily. This output of an L level returns to an H level after the delay time of the inverters of three stages. The output of NAND circuit 130 is inverted by inverter 132 to produce a signal LEQ.

Similarly, a signal TG of a pulse width corresponding to the time difference between the output of inverter 118 and the output of inverter 124 to which the detected result of the precharge command is transmitted is obtained by NAND circuit 126 and inverter 128. The difference in the number of stages of inverters applied to the input of the NAND circuit can be increased to 5 stages, 7 stages, or the like in order to increase the pulse width of signals TG and LEQ.

Signal LEQ must be initiated earlier than signal TG. The output of gate circuit 114 and the output of the third inverter from gate circuit 114 are applied to NAND circuit 130 to output signal LEQ. Also, in order to delay signal TG than signal LEQ, the inputs of the second stage and fifth stage of inverters from gate circuit 114 are applied to NAND circuit 126.

Figure 6:
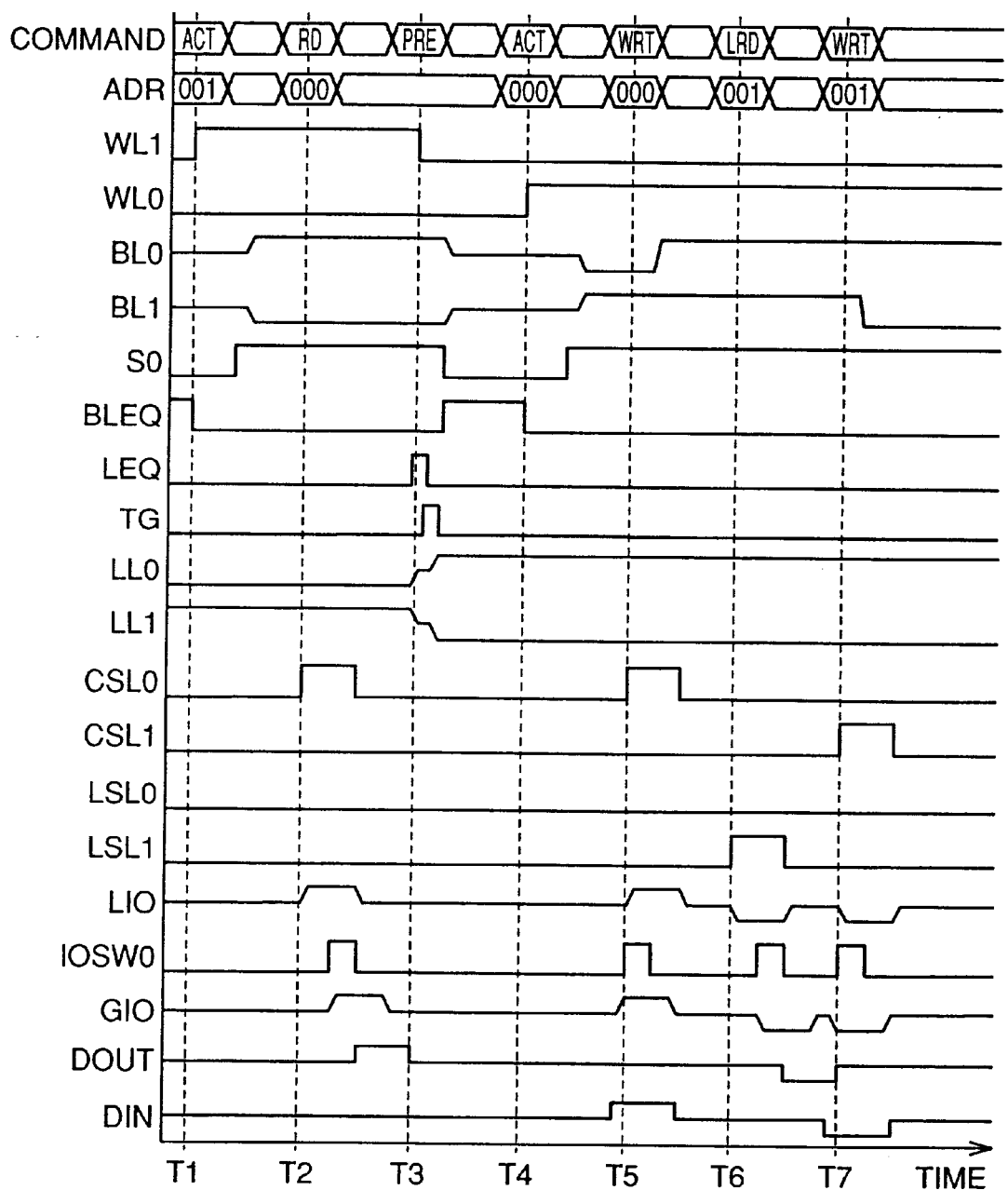
FIG. 6 is an operation waveform diagram to describe an operation of a semiconductor memory device according to a first embodiment of the present invention.

FIG. 6 is an operation waveform diagram to describe an operation of the semiconductor memory device of the first embodiment.

Referring to FIG. 6, active command ACT and address "001" are applied at time T1. In response, signal BLEQ is pulled down to an L level. Equalization of the bit line pair is canceled, and then word line WL1 is rendered active to an H level.

The data retained in memory cells Cell10 and Cell11 selected by word line WL1 are transmitted to the bit lines. Sense amplifier activation signal S0 is pulled up to an H level, whereby the small potential difference at the bit line pair is amplified. As a result, bit line BL0 attains an H level, and bit line BL1 attains an L level. Although not depicted in the waveform chart, bit lines /BL and BL take complementary values.

At time T2, read command RD and address "000" are input, and column select line CSL0 is selected. In response, the value of bit line BL0 is transmitted to local IO line LIO by gate circuit 26. The potential of local IO line LIO attains an H level.

Signal IOSW0 attains an H level, and global IO line GIO attains an H level via the transistor in gate circuit 60. Read amplifier 64 amplifies the H level of global IO line GIO, and data output signal DOUT is driven to an H level.

At time T3, precharge command PRE is input. In response, word line WL1 attains a non-selected state. At the same time, data is transferred to latches 30 and 50. First, signal LEQ attains an H level for a predetermined time, and latch line pair LL, /LL is equalized, so that latches 30 and 50 lose the retained data.

Then, signal TG attains an H level for a predetermined time, and the values of bit line pair BL, /BL are copied to latch line pair LL, /LL. As a result, latch line LL0 attains an H level, and latch line LL1 attains an L level. Although not depicted, latch line /LL takes a value complementary to the value of latch line LL.

Then, signal BLEQ attains an H level, and sense amplifier activation signal S0 attains an L level. In response, sense amplifiers 24 and 44 are rendered inactive, and the bit line pair is equalized.

At time T4, active command ACT and address "000" are input. In response, signal BLEQ attains an L level. Equalization of the bit line pair is canceled, and word line WL0 is selected. The data of memory cells Cell00 and Cell01 selected by word line WL0 are transmitted to bit lines BL0 and BL1, respectively. Then, sense amplifiers 24 and 44 are rendered active. Bit line BL0 attains an L level whereas bit line BL1 attains an H level.

At time T5, write command WRT and address "000" are input. At the same time, write data of an H level is input. This causes data input signal DIN to be pulled up to an H level, whereby global IO line GIO attains an H level. Since signal IOSW is at an H level, the potential of global IO line GIO is transmitted to local IO line LIO, and the potential of local IO line LIO attains an H level. Since column select line CSL0 has its potential set at an H level, the data is transmitted to bit line BL0, whereby the potential thereof is pulled up to an H level. The data retained in memory cell Cell00 is rewritten to an H level.

At time T6, latch read command LRD and address "001" are input. In response, the potential of latch select line LSL1 is driven to an H level. The potential of latch line LL1 is transmitted to local IO line LIO via the transistor, whereby the potential of local IO line LIO is pulled down to an L level. Since signal IOSW0 is at an H level, local IO line LIO is connected to global IO line GIO, so that the potential of global IO line GIO is pulled down to an L level. In response, read amplifier 64 provides a data output signal DOUT of an L level.

At time T7, write command WRT, address "001" and write data of an L level are input. Since data input signal DIN is at an L level, global IO line GIO attains an L level. In response to signal IOSW0 attaining an H level, the data is transmitted to local IO line LIO, so that the potential thereof attains an L level. Column select line CSL1 is selected, and its potential attains an H level. The data of local IO line LIO is transmitted to bit line BL1, so that the potential thereof is pulled down to an L level. The data in memory cell Cell01 is rewritten to an L level.

Although signals TG and LEQ are generated based upon the combination of control signals CS, RAS, CAS and WE received by gate circuit 114 of FIG. 5 since an SDRAM is taken as an example in the first embodiment, the present invention is applicable to other memory devices. In this case, another control is employed of rendering signals LEQ and TG active immediately before the timing of restoring the bit line pair retaining the data read out from the memory cell to the initial state. Although the first embodiment is described corresponding to the case where the data burst length is 1, reading and writing at high speed are similarly allowed even if the burst length is not 1.

Thus, the effective transfer rate can be maintained at high level since one operation is basically carried out by one command even in the case where locations apart from each other by a predetermined address are accessed alternately in the semiconductor memory device of the first embodiment.

Second Embodiment

In the previous first embodiment, the data of the memory cell connected to the word line that is rendered active is unconditionally transferred to the latch when precharge command PRE is input.

In practice, there is often the case where a precharge command PRE is input irrespective of the operation of the application program by an interruption process or the like in a personal computer. The most typical example is the refresh operation of an SDRAM.

In an SDRAM that utilizes a capacitive element as a memory cell, the retained data will be lost by leakage unless a refresh operation is carried out periodically. Before this refresh operation is initiated, the SDRAM must render inactive the activated word lines by executing a precharge command PRE on all banks. In practice, only the operation up to that time is repeated after a refresh operation has been carried out. Therefore, the usage of commands ACT, RD and PRE to transfer data into the latch again is a wasteful process.

In order to solve this problem, means are newly provided to control data transfer into a latch by an external manner in the second embodiment.

Figure 7:
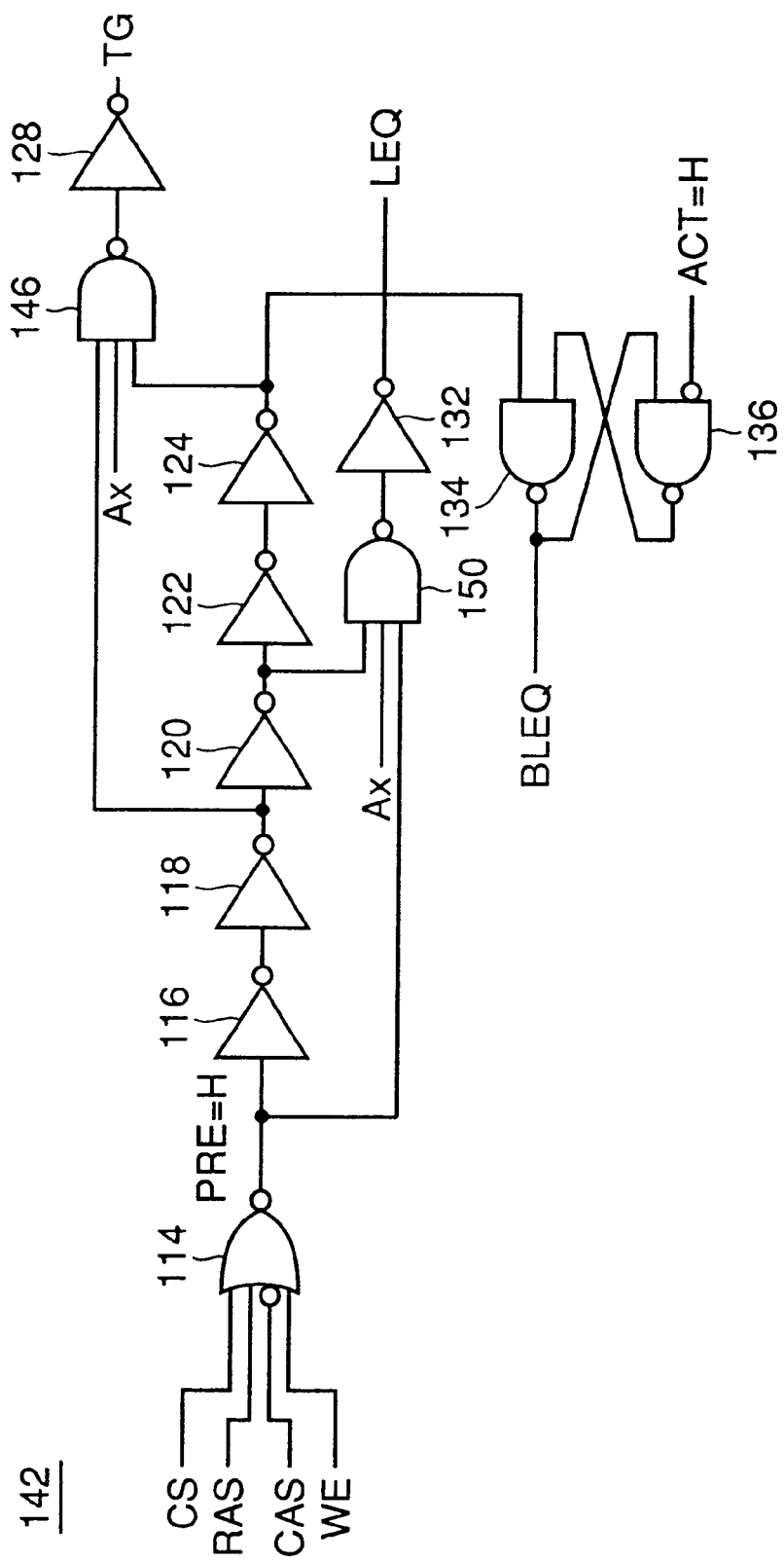
FIG. 7 is a circuit diagram showing a structure of a signal generation circuit 142 used in a second embodiment of the present invention.

FIG. 7 is a circuit diagram showing a structure of signal generation circuit 142 employed in the second embodiment.

Signal generation circuit 142 differs from signal generation circuit 112 shown in FIG. 5 in that a NAND circuit 146 and a NAND circuit 150 are provided instead of NAND circuit 126 and NAND circuit 130, respectively. NAND circuit 146 receives the outputs of inverters 118 and 124 and control signal Ax at its inputs. NAND circuit 150 receives the output of gate circuit 114, the output of inverter 120, as well as control signal Ax. According to such a structure, signals LEQ and TG are generated only when control signal Ax is driven to an H level when precharge command PRE is input.

In other words, external control can be provided using the level of control signal Ax when precharge command PRE is input as to whether data is to be transferred or not from the bit line pair to the latch.

By such a structure, data transfer to a latch can be controlled externally. In the case where determination is made at the memory controller that losing the retained data in the latch is not expedient when a refresh operation or the like is to be carried out, the useless retransfer process of data is not required, so that the effective transfer rate can be maintained at a higher level than that of the first embodiment.

Third Embodiment

In the structure according to the previous first and second embodiments, a column decoder and a latch decoder are provided. In the memory cell array, two types of wiring, i.e. a column select line CSL for the column decoder to select a column and a latch select line LSL for the latch decoder to select a latch provided corresponding to each memory cell column are disposed. In general, the dimension condition in the memory cell array is stringent in order to implement a large memory capacity with a small chip area. Useless interconnection in the memory cell array should be minimized to prevent increase of the memory cell array area.

Figure 8:
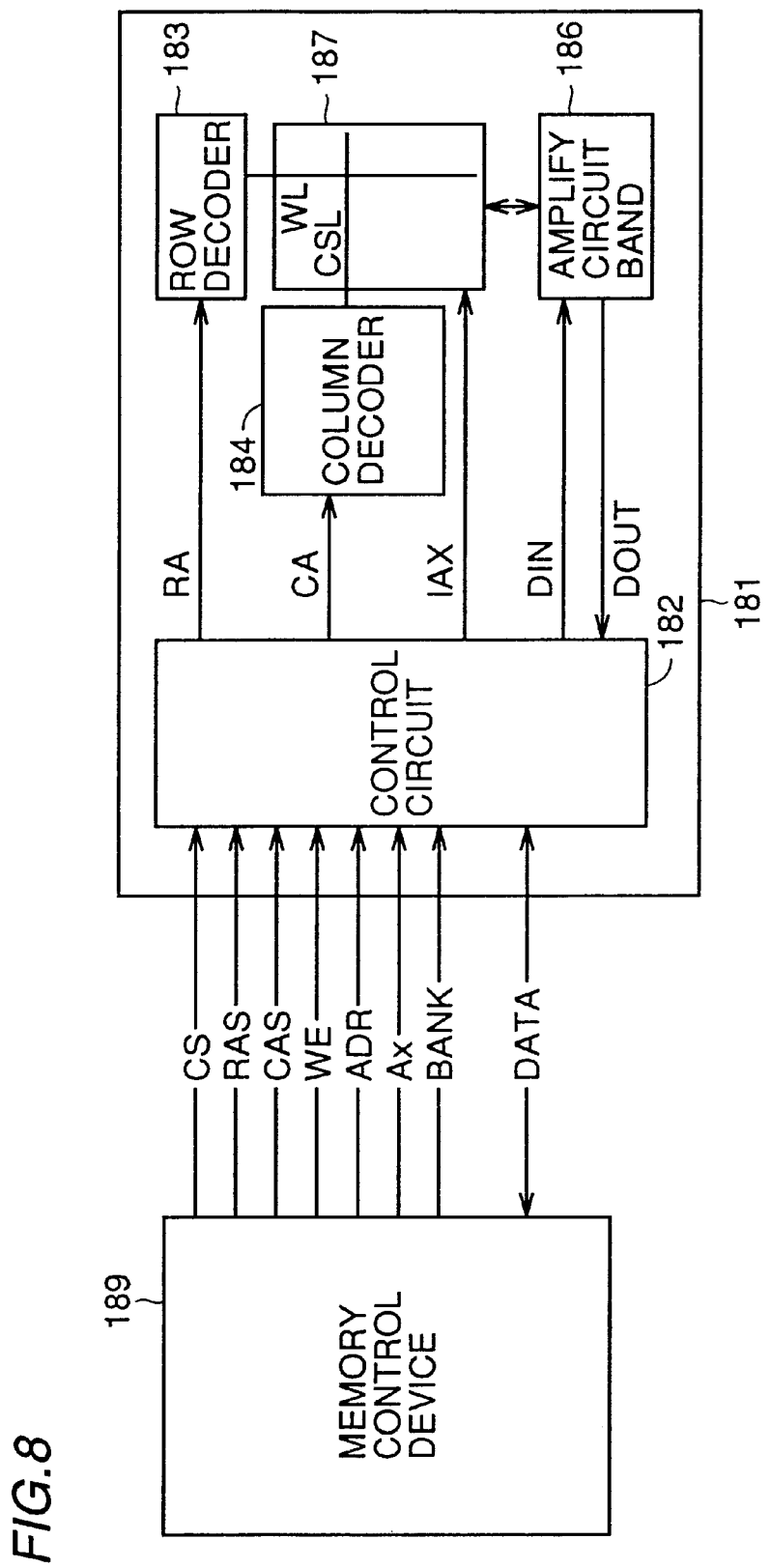
FIG. 8 is a schematic block diagram showing a structure of a semiconductor memory device 181 according to a third embodiment of the present invention.

FIG. 8 is a schematic block diagram showing a structure of a semiconductor memory device 181 according to a third embodiment of the present invention.

Referring to FIG. 8, semiconductor memory device 181 receives control signals CS, RAS, CAS, WE and Ax, an address signal ADR, and a bank address signal BANK from memory control device 189 incorporated in the computer or the like. Semiconductor memory device 181 transfers data DATA to/from a memory control device 189.

Semiconductor memory device 181 includes a control circuit 182 providing a row address RA and a column address CA according to control signals CS, RAS, CAS, WE, Ax and address signals ADR and BANK, and providing data input signal DIN to the memory cell array or receiving data output signal DOUT from the memory cell array, a row decoder 183 rendering one of the plurality of word lines WL active according to row address RA, a column decoder 184 rendering one of the plurality of column select lines CSL active according to column address signal CA, a memory cell array 187, and an amplify circuit band 186 relaying data transfer between memory cell array 187 and control circuit 182.

Figure 9:
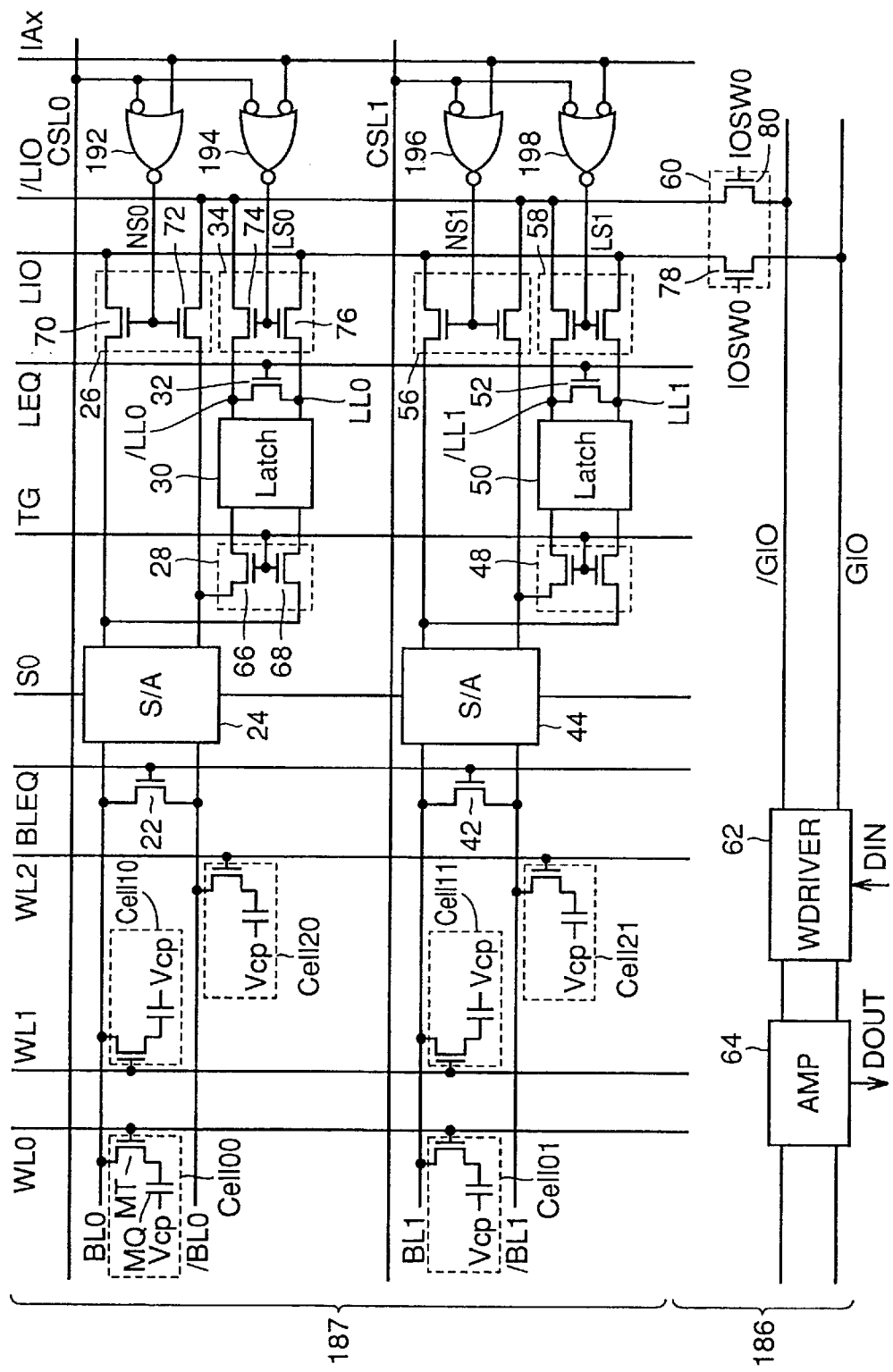
FIG. 9 is a circuit diagram showing a structure of a memory cell array 187 of FIG. 8.

FIG. 9 is a circuit diagram showing a structure of memory cell array 187 of FIG. 8.

Referring to FIG. 9, memory cell array 187 differs in structure from memory cell array 7 of FIG. 3 in that gate circuits 192 and 194 receiving the potential of column select line CSL0 and an internal control signal IAx as inputs, and gate circuits 196 and 198 receiving the potential of column select line CSL1 and internal control signal IAx are additionally provided. Latch select lines LSL0 and LSL1 provided in memory cell array 7 are not provided in memory cell array 187.

Gate circuit 192 renders signal NS0 active to an H level when column select line CLS0 is activated to an H level and internal control signal IAx is at an L level. In other cases, signal NS0 is set to an L level. Signal NS0 is applied to gate circuit 26. When signal NS0 is rendered active, gate circuit 26 connects bit lines BL0, /BL0 to local IO lines LIO, /LIO, respectively.

Gate circuit 194 renders signal LS0 active to an H level when the potential of column select line CSL0 is at an H level and internal control signal IAx is at an H level. Otherwise, signal LS0 is set at an L level. Signal LS0 is applied to gate circuit 34. When signal LS0 is rendered active, gate circuit 34 connects latch lines LL0, /LL0 to local IO lines LIO, /LIO, respectively.

Gate circuit 196 renders signal NS1 active to an H level when column select line CSL1 is rendered active to an H level and internal control signal IAx is at an L level. Otherwise, signal NS1 is set to an L level. Signal NS1 is applied to gate circuit 56. When signal NS1 is rendered active, gate circuit 56 connects bit lines BL1, /BL1 to local IO lines LIO, /LIO, respectively.

Gate circuit 198 renders a signal LS1 active to an H level when column select line CSL1 is at an H level and internal control signal IAx is at an H level. Otherwise, signal LS1 is set at an L level. Signal LS1 is supplied to gate circuit 58. When signal LS1 is rendered active, gate circuit 58 connects latch lines LL1, /LL1 to local IO lines LIO, /LIO, respectively.

The remaining components of memory cell array 187 are similar to those of memory cell array 7 described with reference to FIG. 3. Therefore, description thereof will not be repeated.

As described above, selection of a latch provided corresponding to each memory cell column is effected at gate circuits 192–198 by the column select line rendered active by the column decoder and internal control signal IAx rendered active corresponding to the latch read command. Since the latch decoder is not required, and latch select line LSL is not required in the memory cell array, the dimension of the memory cell array can be reduced.

Fourth Embodiment

A semiconductor memory device generally includes a plurality of memory cell array blocks, and a portion of the row address is often used to select one of the plurality of memory cell blocks.

Since a row is addressed in the general readout, the block that includes the relevant memory cell row can be selected. However, in the case where a latch is provided corresponding to each column, the block to which the word line selected right before must be recorded since a row address is not input when a data readout command is input from the latch, as described in the previous first to third embodiments.

Figure 10:
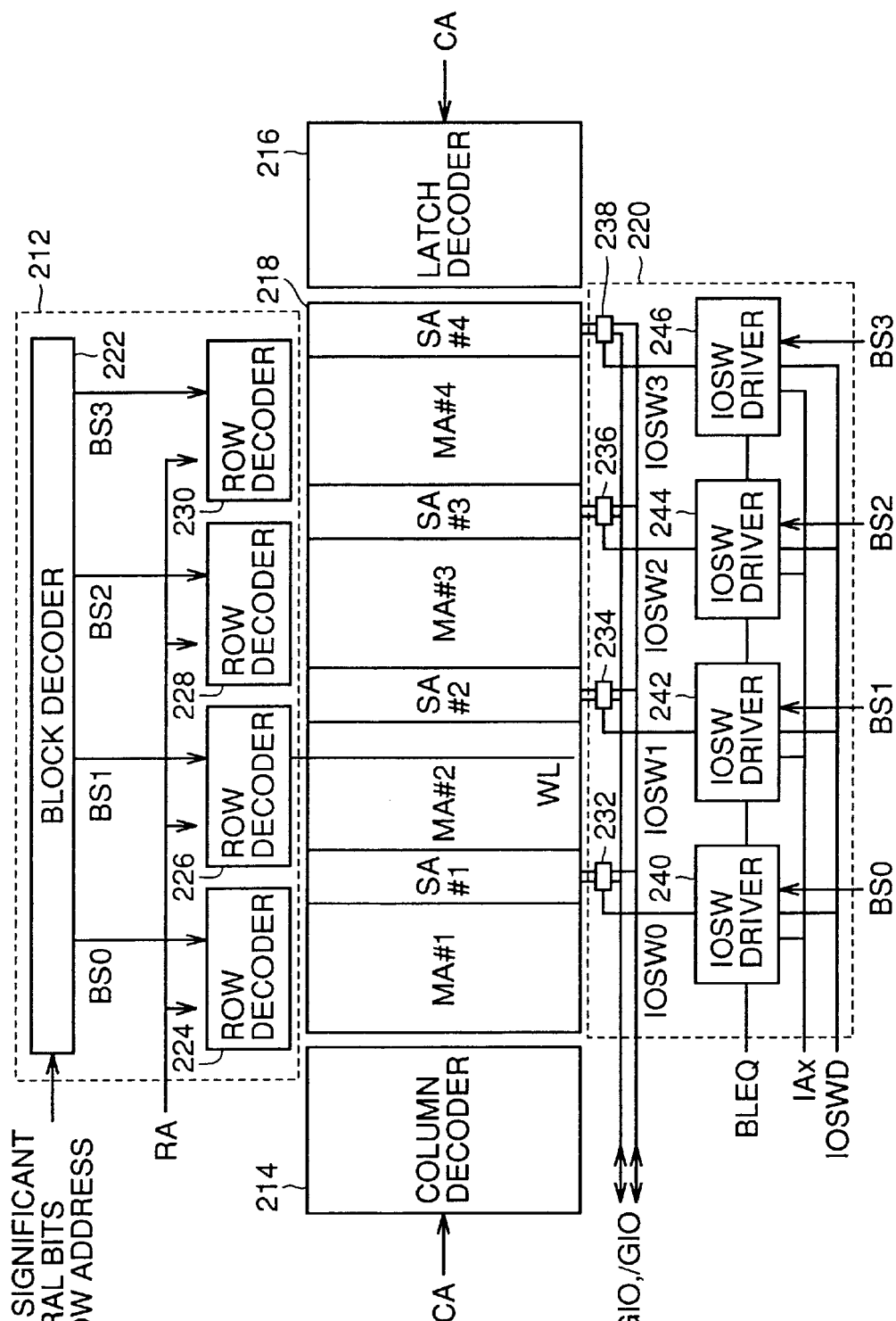
FIG. 10 is a block diagram showing a structure of a memory cell array and a peripheral circuit thereof employed in a semiconductor memory device according to a fourth embodiment of the present invention.

FIG. 10 is a block diagram showing a structure of a memory cell array and a peripheral circuit employed in a semiconductor memory device of the fourth embodiment.

Referring to FIG. 10, a memory cell array 218 in the semiconductor device of the fourth embodiment includes memory cell array blocks MA#1–MA#4, and sense amplifier bands SA#1–SA#4 corresponding to each memory cell array block. A column decoder 214 is provided to select a column in memory cell array 218. Also, a latch decoder 216 is provided to select a latch provided corresponding to a row.

A row select circuit 212 to select a row in a memory cell array includes a block decoders 222 receiving several bits from the highest order of the row address to output block select signals BS0–BS3 to select a memory cell array block, and row decoders 224–230 receiving and decoding row address RA provided corresponding to memory cell array blocks MA#1–MA#4, respectively, to select a row. Row decoders 224–230 are rendered active according to block select signals BS0–BS3.

An input/output select circuit 220 to transfer data to/from memory cell array 218 includes IOSW drivers 240–246 rendered active according to block select signals BS0–BS3, respectively, and gate circuits 232–238 transmitting data read out from sense amplifier bands SA#1–SA#4 to global IO lines GIO, /GIO according to signals IOSW0–IOSW3, respectively.

IOSW drivers 240–246 all receive signal BLEQ, internal control signal IAx, and switch drive signal IOSWD.

Figure 11:
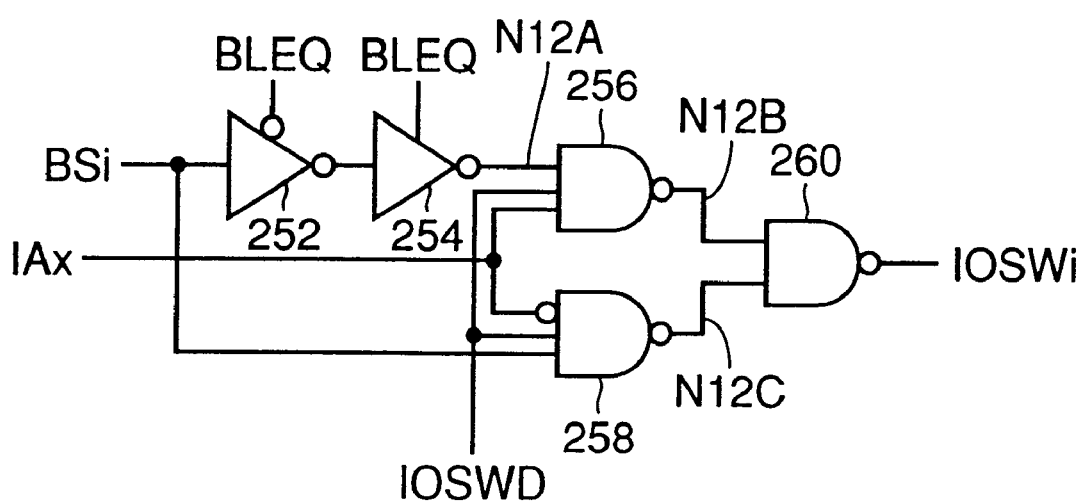
FIG. 11 is a circuit diagram showing a structure of an IOSW driver 240 of FIG. 10.

FIG. 11 is a circuit diagram showing a structure of IOSW driver 240 of FIG. 10.

Referring to FIG. 11, IOSW driver 240 includes a clocked inverter 252 rendered active when signal BLEQ is at an L level to receive and invert block select signal BSi for output, a clocked inverter 254 rendered active when signal BLEQ is at an H level to receive and invert the output of clocked inverter 252 to provide to a node N12A, and a NAND circuit 256 receiving switch drive signal IOSWD, internal control signal IAx and the potential of node N12A.

IOSW driver 240 also includes a gate circuit 258 providing an output of an L level when internal control signal IAx is at an L level and block select signal BSi and switch drive signal IOSWD are both at an H level. The output of NAND circuit 256 is provided to node N12B. The output of gate circuit 258 is provided to node N12C.

IOSW driver 240 further includes a NAND circuit 260 having inputs connected to node N12B and node N12C to output a signal IOSWi.

More specifically, clocked inverters 252 and 254 form a retain unit that temporarily stores a block select signal. NAND circuits 256, 260 and gate circuit 258 output either the currently input block select signal or the block select signal in the retain unit according to internal control signal IAx.

Block select signal BSi corresponds to block select signal BS0 of FIG. 10. Signal IOSWi corresponds to signal IOSW0.

IOSW drivers 242, 244 and 246 in FIG. 10 have a structure similar to that of IOSW driver 240 shown in FIG. 11. Therefore, description thereof will not be repeated. In the case of IOSW driver 242, signals BSi and IOSWi correspond to signals BS1 and IOSW1, respectively. In the case of IOSW driver 244, signals BSi and IOSWi correspond to signals BS2 and IOSW2, respectively. In the case of IOSW driver 246, signals BSi and IOSWi correspond to signals BS3 and IOSW3, respectively.

Figure 12:
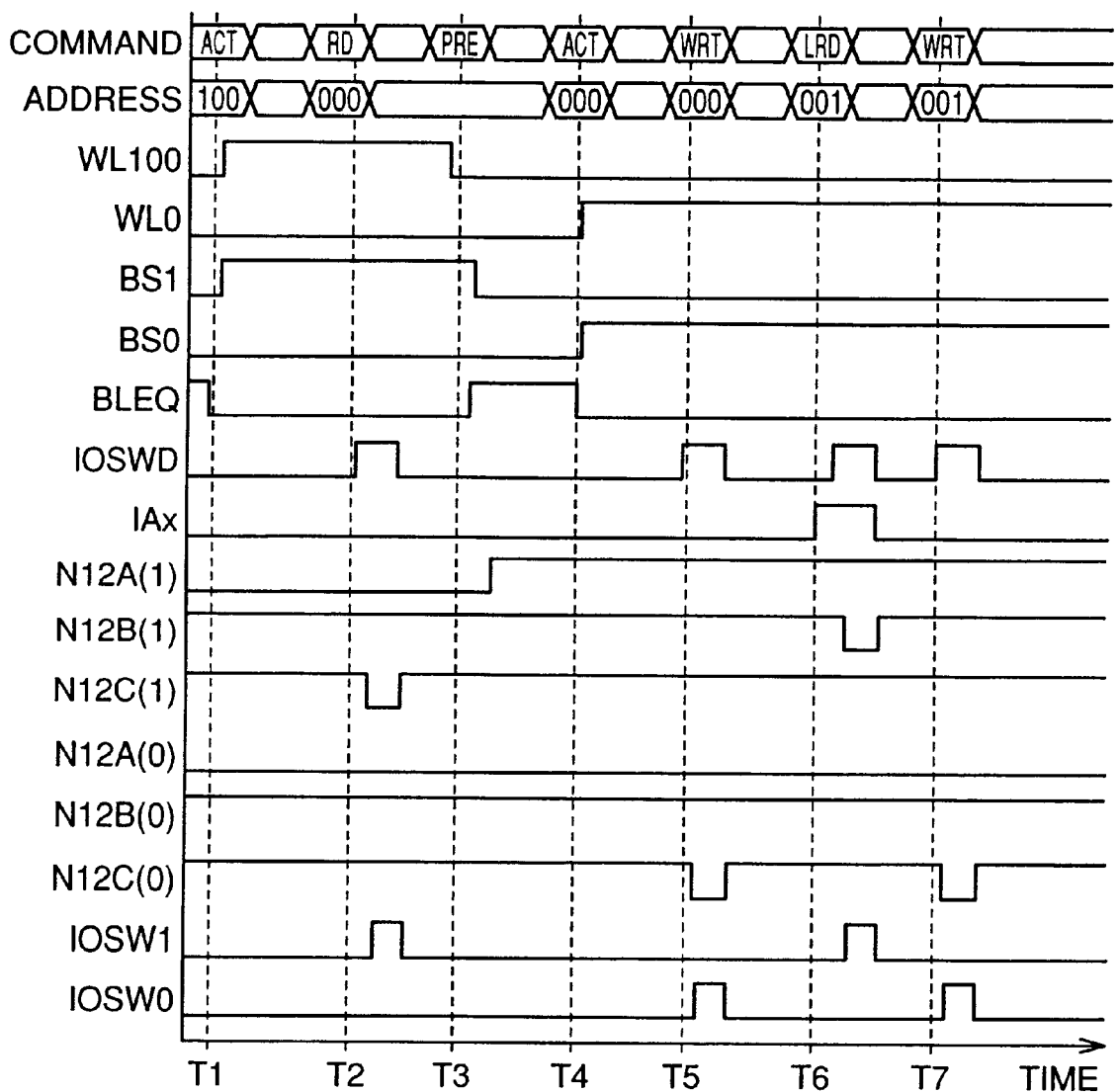
FIG. 12 is an operation waveform diagram to describe a structure of a semiconductor memory device according to the fourth embodiment.

FIG. 12 is an operation waveform diagram to describe an operation of the semiconductor memory device of FIG. 4.

Referring to FIG. 12, the word line correspond to row address "000" belongs to block 0, whereas the word line corresponding to row address "100" belongs to block 1. At time T1, active command ACT is input. Row address "100" is input. In response, signal BLEQ is pulled down to an L level, and word line WL100 is selected. Block select signal BS1 is pulled up to an H level from an L level.

At time T2, read command RD is input. Column address "000" is input. In response, switch drive signal IOSWD is rendered active to an H level. Here, internal control signal IAx is at an L level. Node N12C(1) in IOSW driver 242 corresponding to memory cell array block MA#1 attains an L level. As a result, signal IOSW1 is driven to an H level.

At time T3, precharge command PRE is input. In response, the potential of word line WL100 attains an L level, and signal BLEQ attains an H level. By the operation of clocked inverter 254, the value of block select signal BSi when signal BLEQ is at an L level is retained in node N12Ai. The potential of node N12A(1) attains an H level, and the potential of node N12A(0) attains an L level. Nodes N12A (1) and N12A(0) indicate node N12A in respective IOSW drivers 242 and 240. The data stored in the memory cell of row address "100" when precharge command PRE is input is transferred to the latch.

At time T4, active command ACT is input again. Row address "000" is input. In response, word line WL0 is selected, whereby the potential thereof is driven to an H level. Also, block select signal BS0 attains an H level.

At time T5, write command WRT is input. Column address "000" is input, so that writing into a memory cell is effected. Since switch drive signal IOSWD is at an H level and internal control signal lAx is at an L level, node N12C(0) is driven to an L level. As a result, signal IOSW0 attains an H level.

At time T6, latch read command LRD is input. In response, switch drive signal IOSWD attains an H level, and node N12B(1) attains an L level. As a result, signal IOSW1 is driven to an H level. By this operation, data is read out from the latch of address "001".

At time T7, write command WRT is input. In response, switch drive signal IOSWD attains an H level. Here, internal control signal IAx is at an L level, and the potential of node N12C(0) attains an L level. As a result, signal IOSW0 is pulled up to an H level. Data is written into the memory cell of column address "001".

Thus, the semiconductor memory device of the fourth embodiment can store the block that was selected right before. Data can be read out speedily from a latch even in a memory of a structure where a block is selected by a row address.

Fifth Embodiment

In the first to fourth embodiments, latch select line LSL can be selected only when in a readout operation. Even if data is written into a latch, that written data will be lost when data of another memory cell is transferred to the latch. Therefore, writing data into a latch from outside of the memory cell array is meaningless.

However, in application towards a personal computer, immediate rewrite with respect to data read out occurs irrespective of the continuous read/write operation from the application program. A typical example is the operation of a memory control device with the error correction function.

In a system with an error correction function, the main memory stores a redundant bit in addition to the data bit. When the memory control device receives the data bit and the redundant bit to detect error in the readout data, the corrected data is passed to the CPU, and the proper data is written into the address corresponding to the erroneous data in the main memory.

The semiconductor memory device of the fifth embodiment is directed to allow a write operation even for a latch by providing the function to transfer the data written in the latch into all the memory cells connected to one word line by one manipulation.

Figure 13:
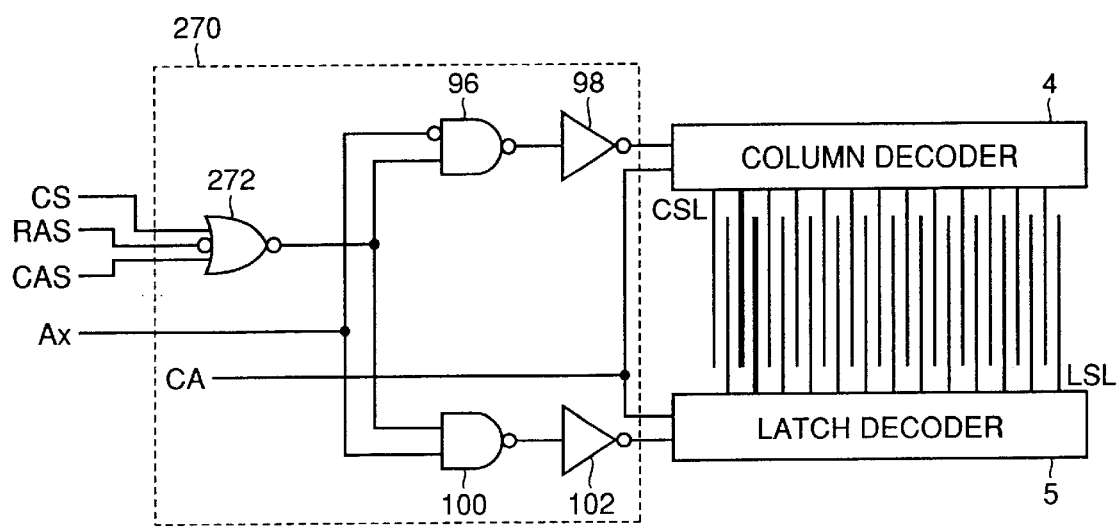
FIG. 13 is a circuit diagram showing a structure to control a column decoder and a latch decoder according to a fifth embodiment of the present invention.

FIG. 13 is a circuit diagram showing a structure of providing control of the column decoder and the latch decoder in the fifth embodiment.

Referring to FIG. 13, a control unit 270 corresponds to a portion in control circuit 2 in the structure of, for example, FIG. 1.

Control unit 270 includes a gate circuit 272 detecting a command for reading and writing according to control signals CS, RAS and CAS, a gate circuit 96 providing an output of an L level when control signal Ax is at an L level and the output of gate circuit 272 is at an H level, and an inverter 98 inverting the output of gate circuit 96.

Control circuit 270 further includes a NAND circuit 100 receiving the output of gate circuit 272 and control signal Ax, and an inverter 102 inverting the output of NAND circuit 100.

The output of inverter 98 renders column decoder 4 active. The output of inverter 102 renders latch decoder 5 active. Gate circuit 272 provides an output of an H level when control signal RAS is at an H level and control signals CS and CAS are at an L level.

More specifically, control unit 270 renders column decoder 4 or latch decoder 5 active according to control signal Ax when a read command or a latch command is input.

Figure 14:
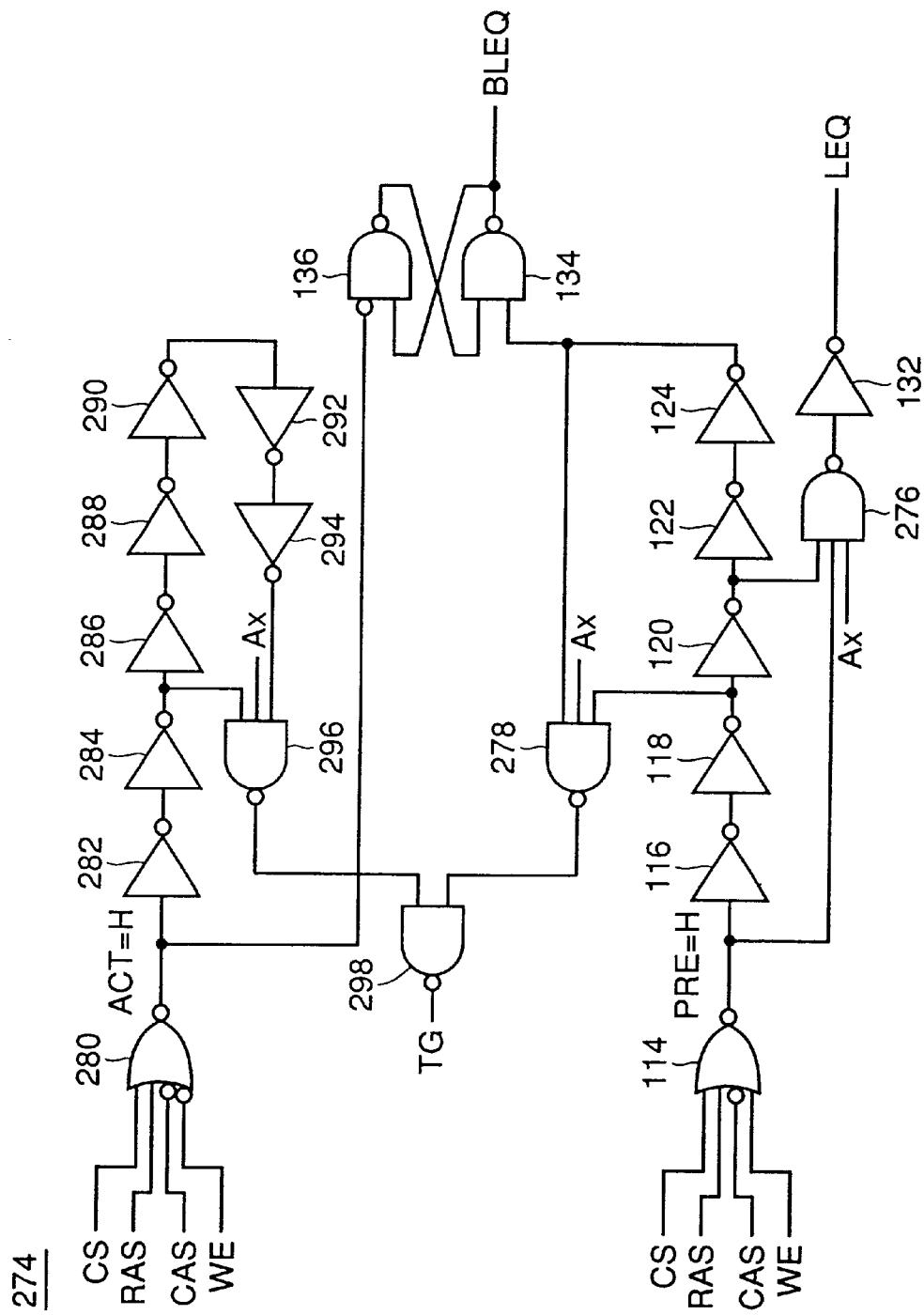
FIG. 14 is a circuit diagram showing a structure of a signal generation circuit 274 of the fifth embodiment.

FIG. 14 is a circuit diagram showing a structure of a signal generation circuit 274 according to the fifth embodiment.

Referring to FIG. 14, signal generation circuit 274 includes NAND circuits 276 and 278 instead of NAND circuits 130 and 126 in the structure of signal generation circuit 112 of FIG. 5, and also includes a gate circuit 280 detecting an active command, inverters 282–294 connected in series receiving the output of gate circuit 280, a NAND circuit 296 receiving the outputs of inverters 284 and 294 and control signal Ax, and a NAND circuit 298 receiving the outputs of NAND circuit 296 and 278.

Control signal Ax is input to NAND circuits 278 and 276. NAND circuit 298 outputs a signal TG. The circuit portion is added of providing pulse from the output of gate circuit 280 detecting an active command in addition to the circuit that generates a pulse by detecting gate circuit 114 that detects a precharge command. A gate to combine the same is provided. Since the load capacitance of the bit line pair is greater than the load capacitance of the latch line pair, signal generation circuit 274 is configured so that the width of the pulse generated by NAND circuit 296 is wider than the width of the pulse generated by NAND circuit 278.

Figure 15:
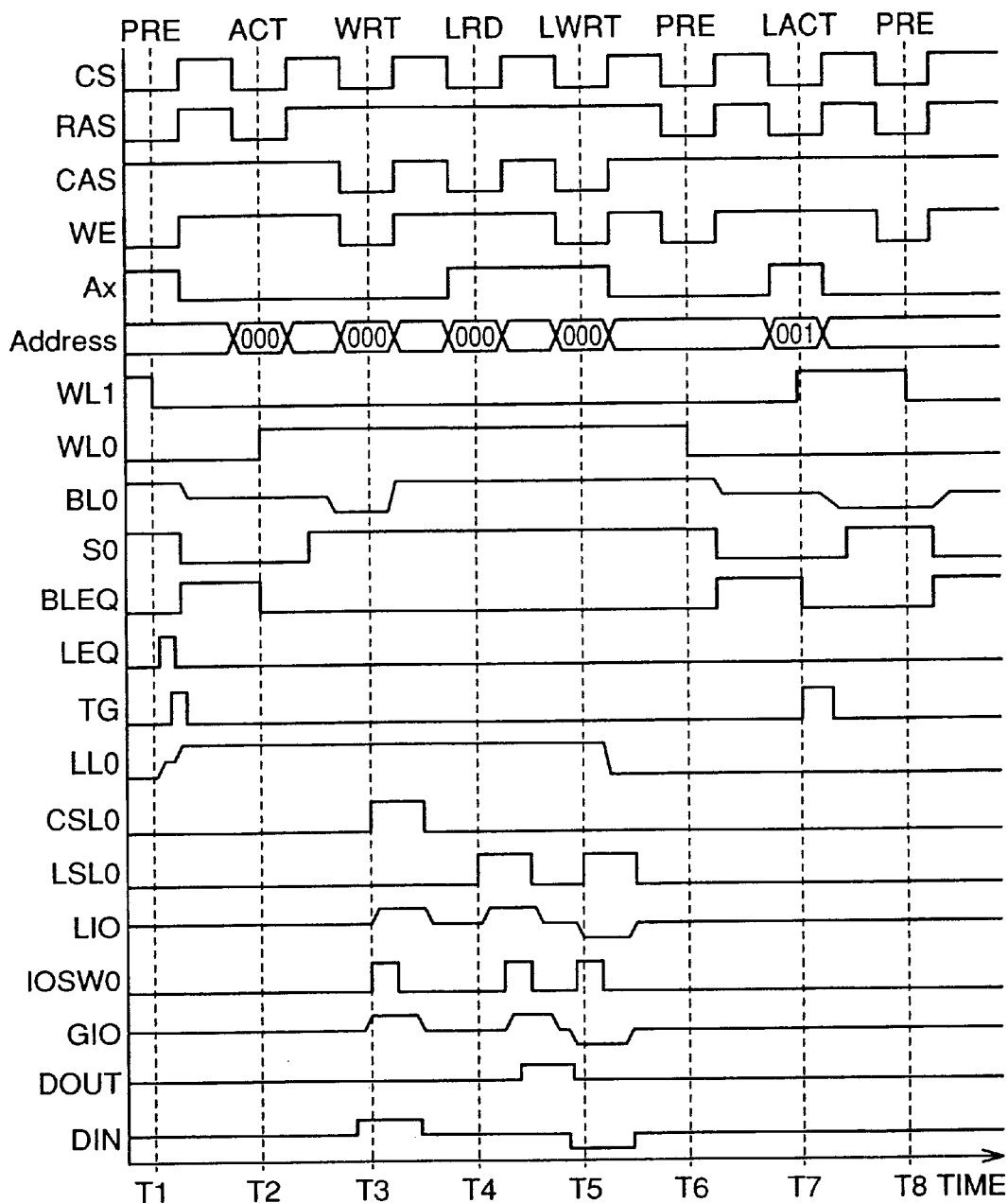
FIG. 15 is an operation waveform diagram to describe an operation of the semiconductor memory device of the fifth embodiment.
Figure 16:
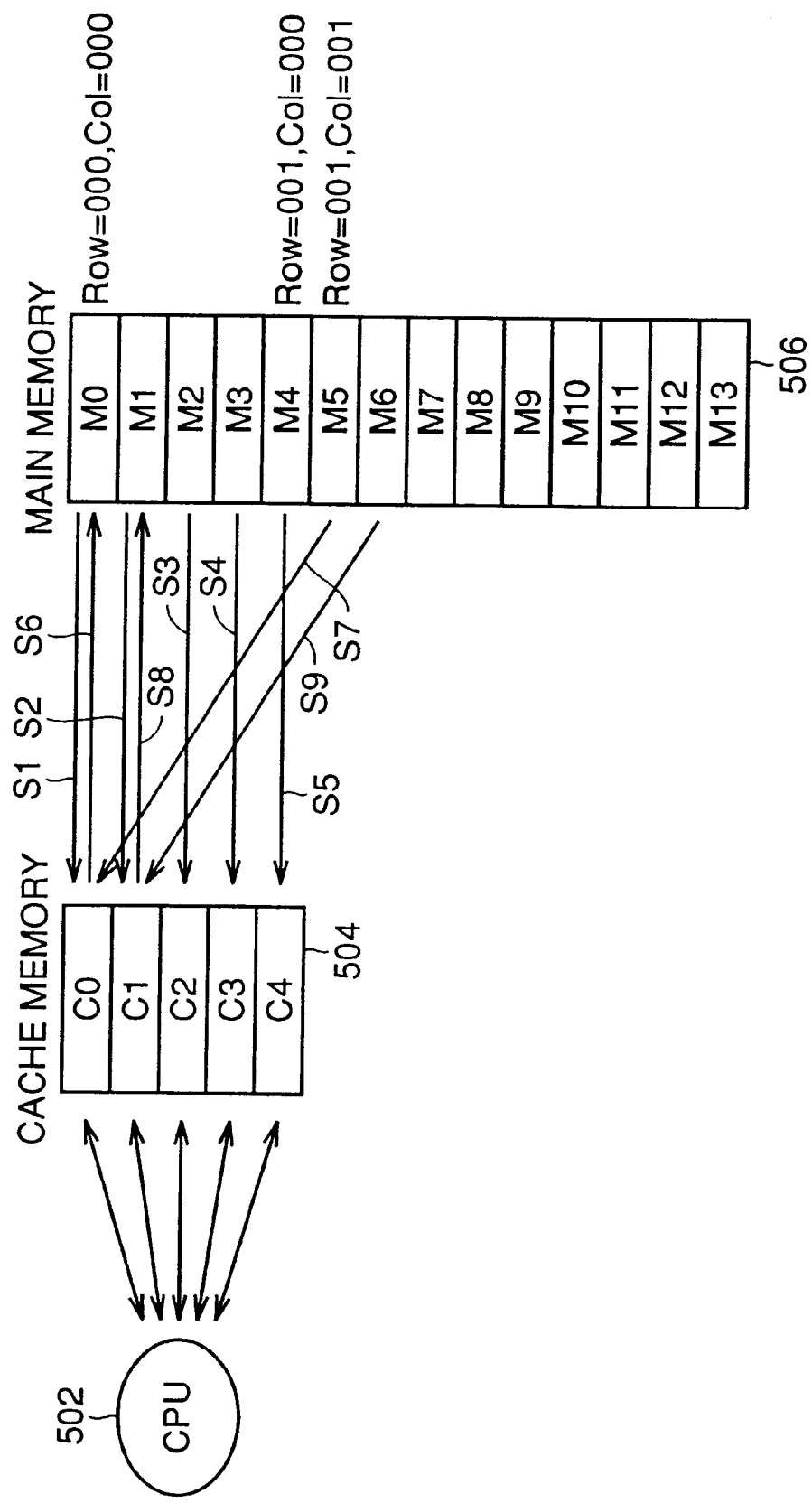
FIG. 16 is a schematic diagram to describe the operation of reading out data, modifying the data, and writing back the modified data.
Figure 17:
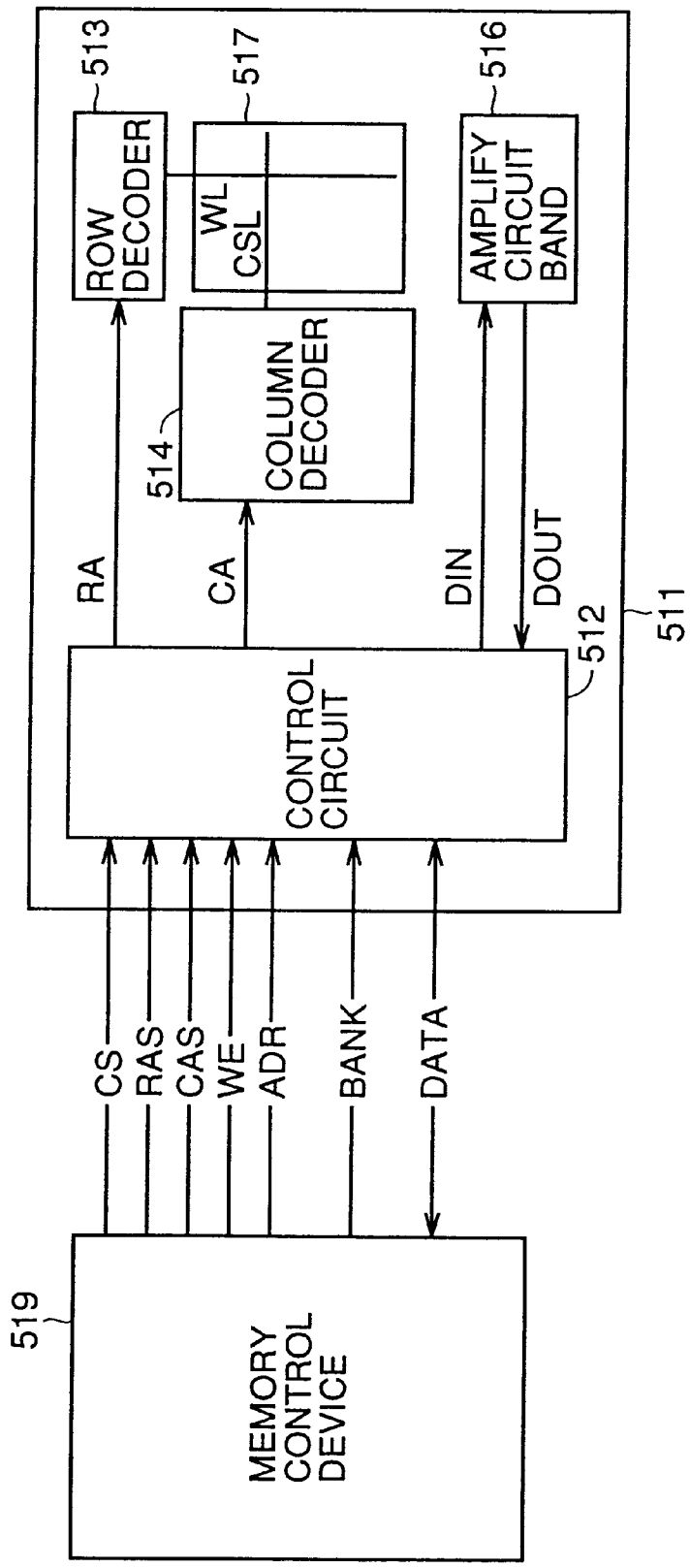
FIG. 17 shows a schematic structure of a conventional semiconductor memory device.
Figure 18:
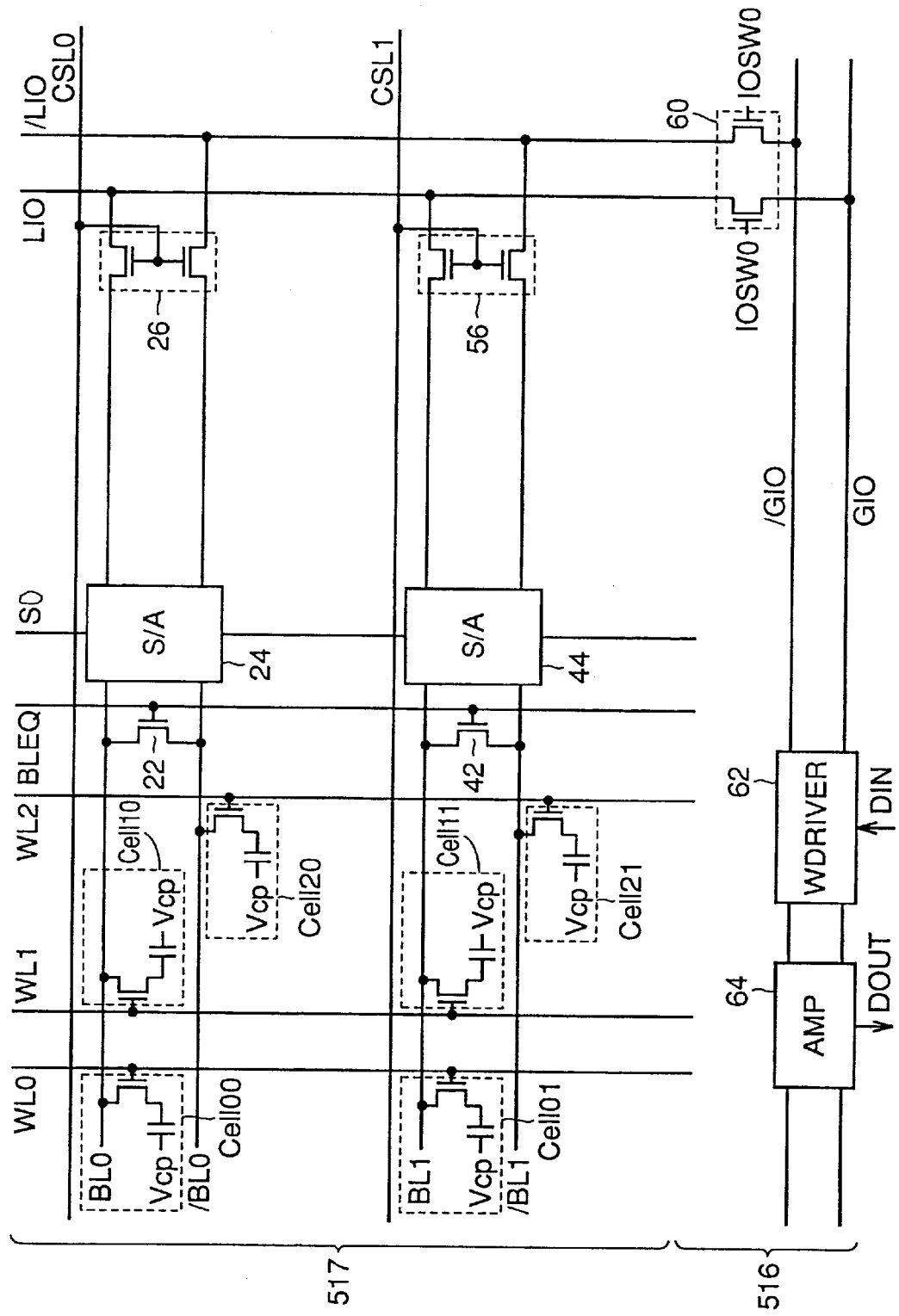
FIG. 18 is a circuit diagram showing a structure of a conventional memory cell array 517 of FIG. 17.
Figure 19:
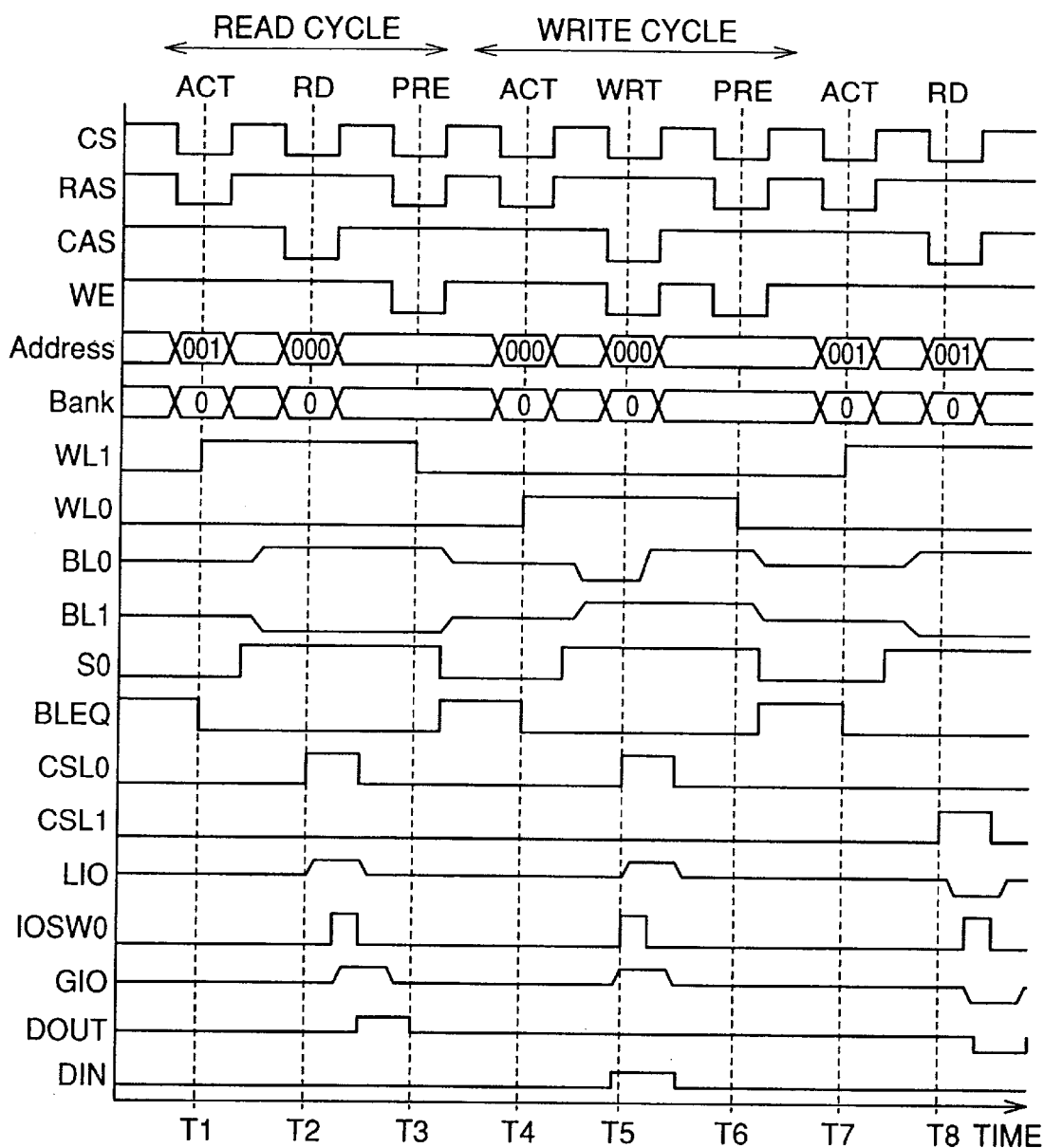
FIG. 19 is an operation waveform diagram to describe the case where access is effected to a main memory using a synchronous semiconductor memory device (SDRAM).

FIG. 15 is an operation waveform diagram to describe an operation of the semiconductor memory device of the fifth embodiment.

At time T1, precharge command PRE is input. Here, control signal Ax is set at an H level. In response, the selected word line WL1 is rendered inactive. Since control signal Ax is at an H level, the data in the memory cell of row address "001" is transferred to a corresponding latch. Latch line LL0 is driven to an H level according to the value of bit line BL0.

At time T2, active command ACT is input. In response, word line WL0 is selected. The data in the memory cell is read out to the bit line. Bit line BL0 attains an L level.

At time T3, write command WRT is input. By an externally applied data input signal DIN of an H level is input, bit line BL0 is driven to an H level. According to this operation, data is written into the memory cell specified by row address "000" and column address "000".

At time T4, latch read command LRD is input. Since control signal Ax is at an H level at the current stage, latch select line LSL0 is rendered active. The data retained in the latch of column address "000" is read out, and latch line LL0 attains an H level. The read out data is transmitted to local IO line LIO and global IO line GIO. Data output signal DOUT of an H level is output.

At time T5, latch write command LWRT is input. Since control signal Ax is at an H level at this current stage, latch select line LSL0 is selected. The externally applied data input signal is transmitted to the latch after the data is read out. Data input signal DIN is at an L level. This signal is transmitted to global IO line GIO and local 10 line LIO. Latch line LL0 is pulled down to an L level. Data of an L level is written to the latch of column address "000". Since word line WL0 can maintain the selected state during this period, access to the memory cells connected to word line WL0 can be carried out at high speed continuously.

At time T6, precharge command PRE is input. In response, word line WL0 is rendered inactive. Since sense amplifier activation signal S0 attains an L level, the sense amplifier is rendered inactive. Signal BLEQ attains an H level, and the bit line pair returns to the intermediate potential of the initial state. At the current stage, data is not transferred since control signal Ax is at an L level. If control signal Ax is set to an H level, the data in the memory cell connected to word line WL0 will be written into the latch, so that the data written into column address "000" at time T5 will be lost. In the case where data is to be written from a latch to a memory cell connected to a particular word line, the word line already rendered active must be rendered inactive since the bit line pair must be returned to the precharged initial state.

At time T7, command LACT is input. Signal BLEQ attains an L level, and equalization of the bit lines is canceled. Then, signal TG attains an H level. Word line WL1 is a selected at the same time the data of the latch line pair is transmitted to the bit line pair.

In general, the potential of the bit line pair changes according to the value of the memory cell connected to word line WL1. The potential of the bit line pair is determined by amplifying this potential difference with sense amplifier when sense amplifier activation signal S0 attains an H level. However, since the charge supplied from the latch line pair exceeds the charge of the memory cell significantly. Therefore, the bit line pair is altered according to the data stored in the latch, which is amplified by the sense amplifier, and the potential of the bit line pair is determined.

At time T8, precharge command PRE is input. The memory cell connected to word line WL1 is rewritten according to the data retained in the latch. Data transfer is completed by rendering word line WL1 inactive.

The write operation into a latch and the transfer operation of the written data into a memory cell has been described in detail in the foregoing.

By the above-described structure, reading and writing can be effected arbitrarily with respect to the cell connected to the column select line and latch select line without having to operate the row address. The data transfer rate can be maintained at an extremely high level in practice.

In the fifth embodiment, data can be written into a latch from the outside the memory cell array. Also, the rewritten data in the latch can be transferred to the memory cell connected to the word line. Therefore, a semiconductor memory device can be realized accommodating the needs without reducing the effective data transfer rate in the case where immediate rewrite is requested from a memory control circuit having an error correction function with respect to a readout address from the main memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in a matrix;
   a plurality of word lines each provided corresponding to a row of said plurality of memory cells;
   a plurality of bit line pairs each provided corresponding to a column of said plurality of memory cells;
   a plurality of sense amplifiers provided corresponding to said plurality of bit line pairs, respectively;
   a data line pair provided common to said plurality of bit line pairs to transfer stored data with an external source;
   a plurality of first connection circuits selectively connecting said plurality of bit line pairs to said data line pair according to an applied column address;
   a plurality of data retain circuits provided corresponding to said plurality of bit line pairs, respectively; and
   a plurality of second connection circuits in parallel respectively with said first connection circuits and connecting said plurality of data retain circuits to said plurality of bit line pairs, respectively.

2. A semiconductor memory device comprising:
   a plurality of memory cells arranged in a matrix;
   a plurality of word lines each provided corresponding to a row of said plurality of memory cells;
   a plurality of bit line pairs each provided corresponding to a column of said plurality of memory cells;
   a plurality of sense amplifiers provided corresponding to said plurality of bit line pairs, respectively;
   a data line pair provided common to said plurality of bit line pairs to transfer stored data with an external source;
   a plurality of first connection circuits selectively connecting said plurality of bit line pairs to said data line pair according to an applied column address;
   a plurality of data retain circuits provided corresponding to said plurality of bit line pairs, respectively; and
   a plurality of second connection circuits connecting said plurality of data retain circuits to said plurality of bit line pairs, respectively,
   further comprising a control circuit rendering said plurality of second connection circuits active to transfer data from said plurality of bit line pairs to said plurality of data retain circuits after any of said plurality of word lines is rendered active according to a row select operation and said plurality of amplifiers are activated, and before data initialization of said bit line pair.

3. The semiconductor memory device according to claim 2, said semiconductor memory device being a synchronous semiconductor memory device,
wherein said control circuit comprises
a command detection unit detecting input of a precharge command effecting initialization of said bit line pair by precharging a potential of said plurality of bit line pairs, and
a pulse generation unit providing a pulse signal rendering said plurality of second connection circuits active for a predetermined time according to an output of said command detection unit.

4. The semiconductor memory device according to claim 3, wherein said pulse generation unit is selectively rendered active according to an externally applied control signal to output said pulse signal.

5. The semiconductor memory device according to claim 2, further comprising a plurality of third connection circuits selectively connecting said plurality of data retain circuits to said data line pair according to an applied column address.

6. The semiconductor memory device according to claim 5, further comprising:
a first address decode circuit selecting one of said plurality of first connection circuits according to said column address; and
a second address decode circuit selecting one of said plurality of third connection circuits according to said column address.

7. The semiconductor memory device according to claim 5, further comprising:
an address decode circuit selecting any one of said column of memory cells according to said column address; and
a gate circuit selecting and rendering active one of said first and third connection circuits corresponding to a column selected by said address decode circuit according to a control signal.

8. A semiconductor memory device comprising:
a plurality of memory cells arranged in a matrix;
a plurality of word lines each provided corresponding to a row of said plurality of memory cells;
a plurality of bit line pairs each provided corresponding to a column of said plurality of memory cells;
a plurality of sense amplifiers provided corresponding to said plurality of bit line pairs, respectively;
a data line pair provided common to said plurality of bit line pairs to transfer stored data with an external source;
a plurality of first connection circuits selectively connecting said plurality of bit line pairs to said data line pair according to an applied column address;
a plurality of data retain circuits provided corresponding to said plurality of bit line pairs, respectively; and
a plurality of second connection circuits connecting said plurality of data retain circuits to said plurality of bit line pairs, respectively,
further comprising a control circuit rendering said plurality of second connection circuits active and transferring data from said plurality of data retain circuits to said plurality of bit line pairs when any of said plurality of word lines is rendered active according to a row select operation and said sense amplifier is at an inactive state.

9. The semiconductor memory device according to claim 8, said semiconductor memory device being a synchronous semiconductor memory device,
wherein said control circuit comprises
a command detection unit detecting input of an active command that effects activation of said row of memory cells, and
a pulse generation unit providing a pulse signal that renders said plurality of second connection circuits active for a predetermined time according to an output of said command detection unit.

10. A semiconductor memory device comprising a plurality of memory cell arrays blocks,
each said memory cell array block including
a plurality of memory cells arranged in a matrix,
a plurality of word lines each provided corresponding to a row of said plurality of memory cells,
a plurality of bit line pairs each provided corresponding to a column of said plurality of memory cells,
a plurality of sense amplifiers provided corresponding to said plurality of bit line pairs, respectively,
a local data line pair provided common to said plurality of bit line pairs to transfer stored data with an external source,
a plurality of first connection circuits selectively connecting said plurality of bit line pairs to said local data line pair according to a column address,
a plurality of data retain circuits provided corresponding to said plurality of bit line pairs, respectively,
a plurality of second connection circuits connecting said plurality of data retain circuits to said plurality of bit line pairs, respectively,
a block decode circuit selecting any of said plurality of memory cell array blocks according to an applied row address; and
a select circuit transferring data with any of said plurality of memory cell array blocks according to an output of said block decode circuit,
said select circuit including
a global data line pair provided common to said plurality of memory cell array blocks,
a plurality of switch circuits provided corresponding to said plurality of memory cell array blocks, respectively, selectively connecting said local data line pair of said plurality of memory cell array blocks to said global data line pair, and
a switch drive circuit rendering active one of said plurality of switch circuits according to an output of said block decode circuit, said switch drive circuit having a retain unit retaining an output of said block decode circuit.

11. The semiconductor memory device according to claim 10, wherein said switch drive circuit further includes a drive signal generation unit receiving outputs of said block decode circuit and said retain unit to render active said switch circuit according to one of the received outputs.

* * * * *